(12) United States Patent
Yu et al.

(10) Patent No.: US 11,133,258 B2
(45) Date of Patent: Sep. 28, 2021

(54) PACKAGE WITH BRIDGE DIE FOR INTERCONNECTION AND METHOD FORMING SAME

(71) Applicant: Taiwan Semiconductor Manufacturing Company, Ltd., Hsinchu (TW)

(72) Inventors: Chen-Hua Yu, Hsinchu (TW); An-Jhih Su, Taoyuan (TW); Chi-Hsi Wu, Hsinchu (TW); Der-Chyang Yeh, Hsinchu (TW); Ming Shih Yeh, Zhubei (TW); Tsung-Shu Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/671,954

(22) Filed: Nov. 1, 2019

(65) Prior Publication Data

US 2021/0020574 A1 Jan. 21, 2021

Related U.S. Application Data

(60) Provisional application No. 62/875,162, filed on Jul. 17, 2019.

(51) Int. Cl.
| | | |
|---|---|---|
| *H01L 23/538* | (2006.01) | |
| *H01L 25/10* | (2006.01) | |
| *H01L 25/00* | (2006.01) | |
| *H01L 21/48* | (2006.01) | |

(52) U.S. Cl.
CPC ........ *H01L 23/5381* (2013.01); *H01L 21/486* (2013.01); *H01L 21/4853* (2013.01); *H01L 23/5384* (2013.01); *H01L 23/5386* (2013.01); *H01L 25/105* (2013.01); *H01L 25/50* (2013.01)

(58) Field of Classification Search
CPC ............ H01L 23/5381; H01L 23/5384; H01L 23/5386
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |

(Continued)

FOREIGN PATENT DOCUMENTS

| | | |
|---|---|---|
| KR | 20160102545 A | 8/2016 |
| KR | 20190068455 A | 6/2019 |

(Continued)

*Primary Examiner* — Errol V Fernandes
(74) *Attorney, Agent, or Firm* — Slater Matsil, LLP

(57) ABSTRACT

A structure includes a bridge die. The bridge die includes a semiconductor substrate; and an interconnect structure over the semiconductor substrate. The interconnect structure includes dielectric layers and conductive lines in the dielectric layers, an encapsulant encapsulating the bridge die therein, and a redistribution structure over the bridge die. The redistribution structure includes redistribution lines therein. A first package component and a second package component are bonded to the redistribution lines. The first package component and the second package component are electrically interconnected through the redistribution lines and the bridge die.

19 Claims, 24 Drawing Sheets

(56) References Cited

U.S. PATENT DOCUMENTS

| | | | |
|---|---|---|---|
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 10,651,126 B2 | 5/2020 | Hsiung et al. | |
| 2011/0291288 A1* | 12/2011 | Wu | H01L 24/11 257/774 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2018/0366436 A1* | 12/2018 | Wang | H01L 25/16 |
| 2019/0148329 A1 | 5/2019 | Ting et al. | |

FOREIGN PATENT DOCUMENTS

| | | |
|---|---|---|
| TW | 201926610 A | 7/2019 |
| WO | 2015130264 A1 | 9/2015 |
| WO | 2018182597 A1 | 10/2018 |
| WO | 2019132965 A1 | 7/2019 |

\* cited by examiner

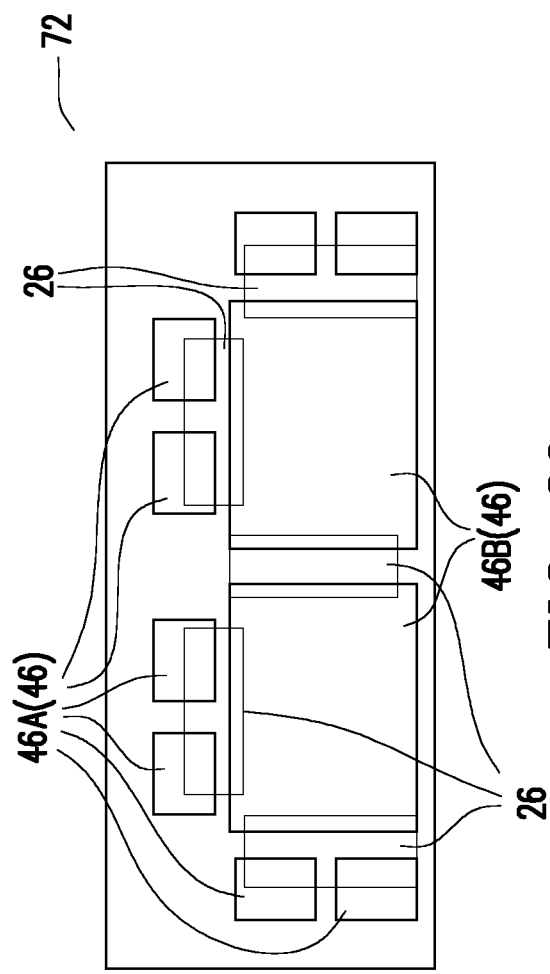
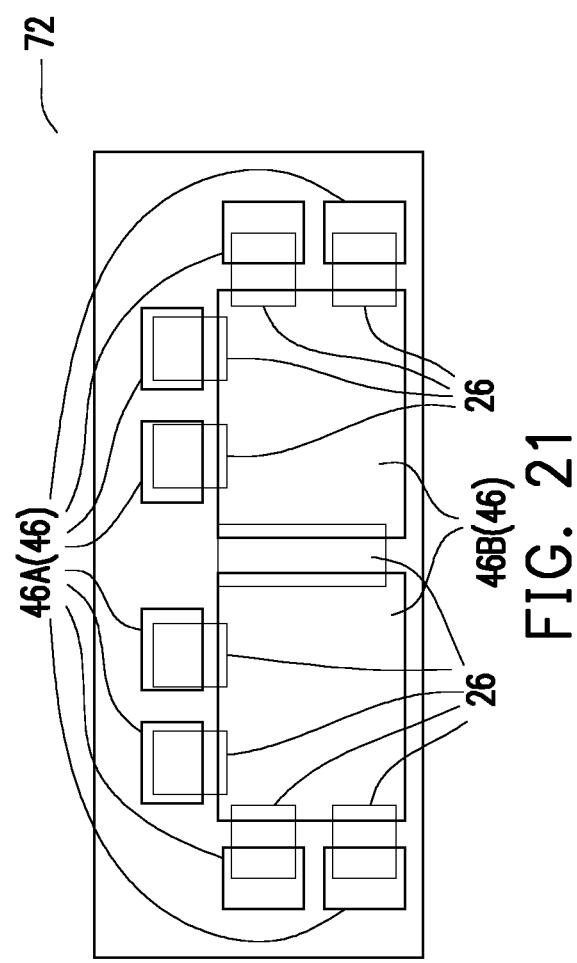

PACKAGE WITH BRIDGE DIE FOR INTERCONNECTION AND METHOD FORMING SAME

PRIORITY CLAIM AND CROSS-REFERENCE

This application claims the benefit of the U.S. Provisional Application No. 62/875,162, filed Jul. 17, 2019, and entitled "Bridge-Die Fan-out Interposer;" which application is hereby incorporated herein by reference.

BACKGROUND

With the evolving of integrated circuits, increasingly more functions are building into integrated circuit packages. Accordingly, the requirement of local communication and interconnection between neighboring device dies and packages also becomes more demanding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20 and 21 illustrate plane views of packages including bridge dies in accordance with some embodiments.

DETAILED DESCRIPTION

Figure 1:
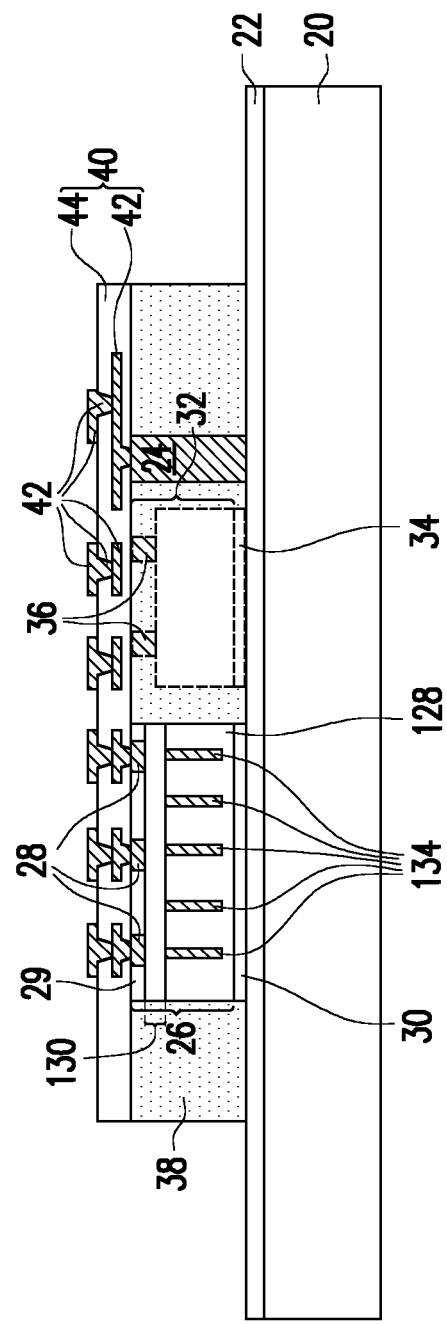
FIGS. 1 through 7 illustrate the cross-sectional views of intermediate stages in the formation of a package including a bridge die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including a bridge die for local interconnection and the method of forming the same are provided in accordance with some embodiments. The intermediate stages in the formation of the package are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order. In accordance with some embodiments of the present disclosure, a bridge die is encapsulated in an encapsulant, over which a redistribution structure including redistribution lines is formed. Two package components such as device dies are bonded to the interconnect structure, and are interconnected through the bridge die.

Figure 25:
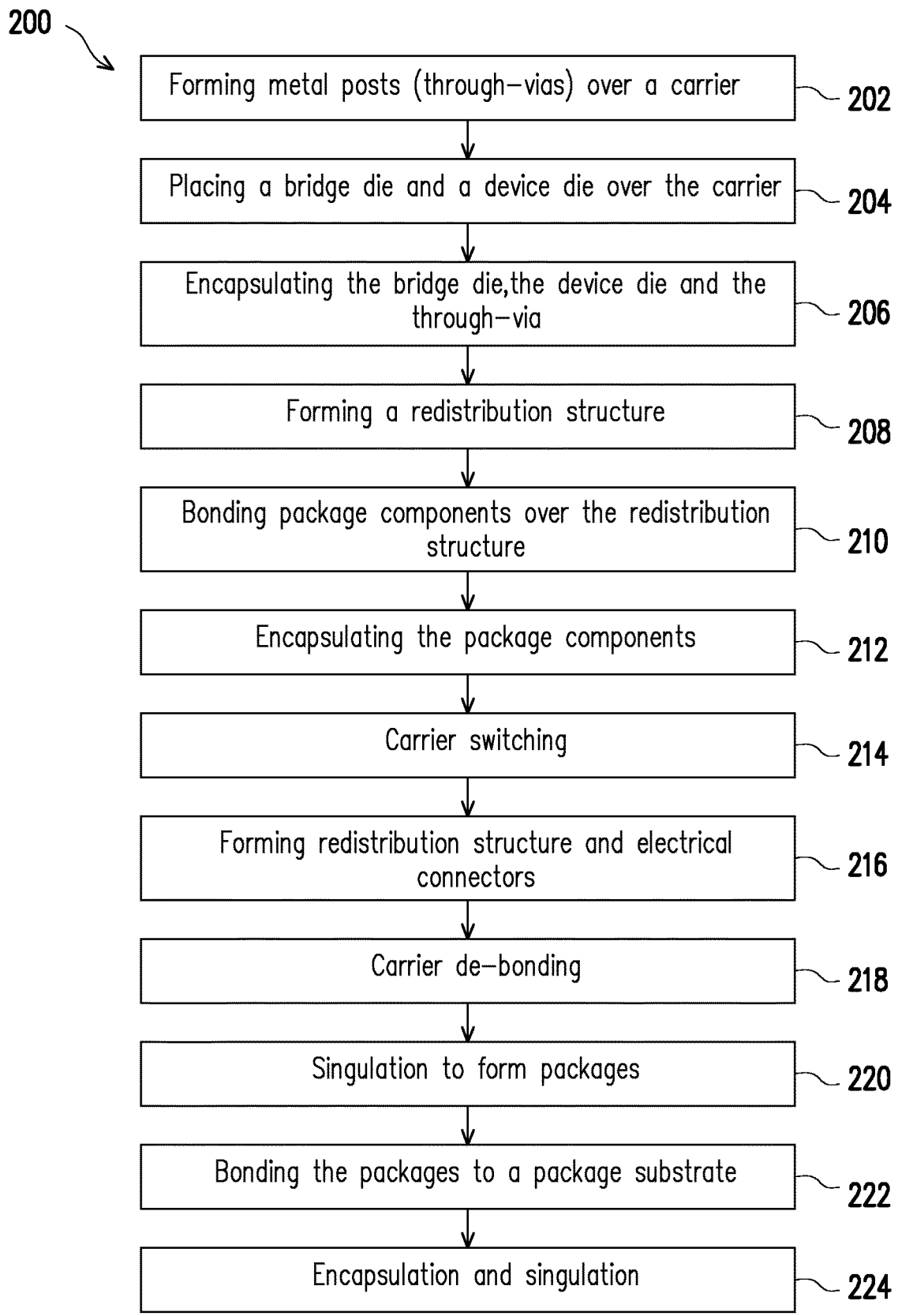
FIG. 25 illustrates a process flow for forming a package in accordance with some embodiments.

FIGS. 1 through 7 illustrate the cross-sectional views of intermediate stages in the formation of a package in accordance with some embodiments of the present disclosure. The corresponding processes are also reflected schematically in the process flow shown in FIG. 25.

FIG. 1 illustrates carrier 20 and release film 22 formed on carrier 20. Carrier 20 may be a glass carrier, an organic carrier, or the like. Carrier 20 may have a round top-view shape, and may have a size of a common silicon wafer. For example, carrier 20 may have an 8-inch diameter, a 12-inch diameter, or the like. Release film 22 may be formed of a polymer-based material (such as a Light-To-Heat-Conversion (LTHC) material), which is capable of being removed along with carrier 20 from the overlying structures that will be formed in subsequent steps. In accordance with some embodiments of the present disclosure, release film 22 is formed of an epoxy-based thermal-release material. Release film 22 may be coated onto carrier 20.

As shown in FIG. 1, metal posts 24 are formed. Although one metal post 24 is illustrated as an example, a plurality of metal posts 24 may be formed. In accordance with some embodiments of the present disclosure, the formation of metal posts 24 includes depositing a metal seed layer (not shown), which may include a titanium layer and a copper layer over the titanium layer. A plating mask (not shown), which may be a photo resist, is coated on the metal seed layer, and is then patterned, so that some portions of the metal seed layer are exposed through a plurality of openings in the plating mask. Next, a metallic material such as copper is plated into the openings and on the exposed portions of the metal seed layer. After the plating process, the plating mask is removed, exposing the underlying portions of the metal seed layer. The exposed portions of the metal seed layer are then etched, leaving the resulting metal posts 24, which includes the plated metallic material and the un-etched portions of the metal seed layer.

After the formation of metal posts 24, bridge die 26 is placed over carrier. The respective process is illustrated as process 204 in the process flow shown in FIG. 25. Bridge die 26 is attached to release film 22 through die-attach film 30, which is an adhesive film. In accordance with some embodiments of the present disclosure, bridge die 26 includes semiconductor substrate 128, through-vias (also referred to as through-semiconductor vias or through-silicon vias (TSVs)) 134, and interconnect structure 130 over through-vias 134. Interconnect structure 130 includes metal lines and vias electrically connecting to through-vias 134. Metal pillars 28 are at the top surface of bridge die 26, and are also electrically connected to the metal lines, vias, and through-vias 134.

Figure 22:
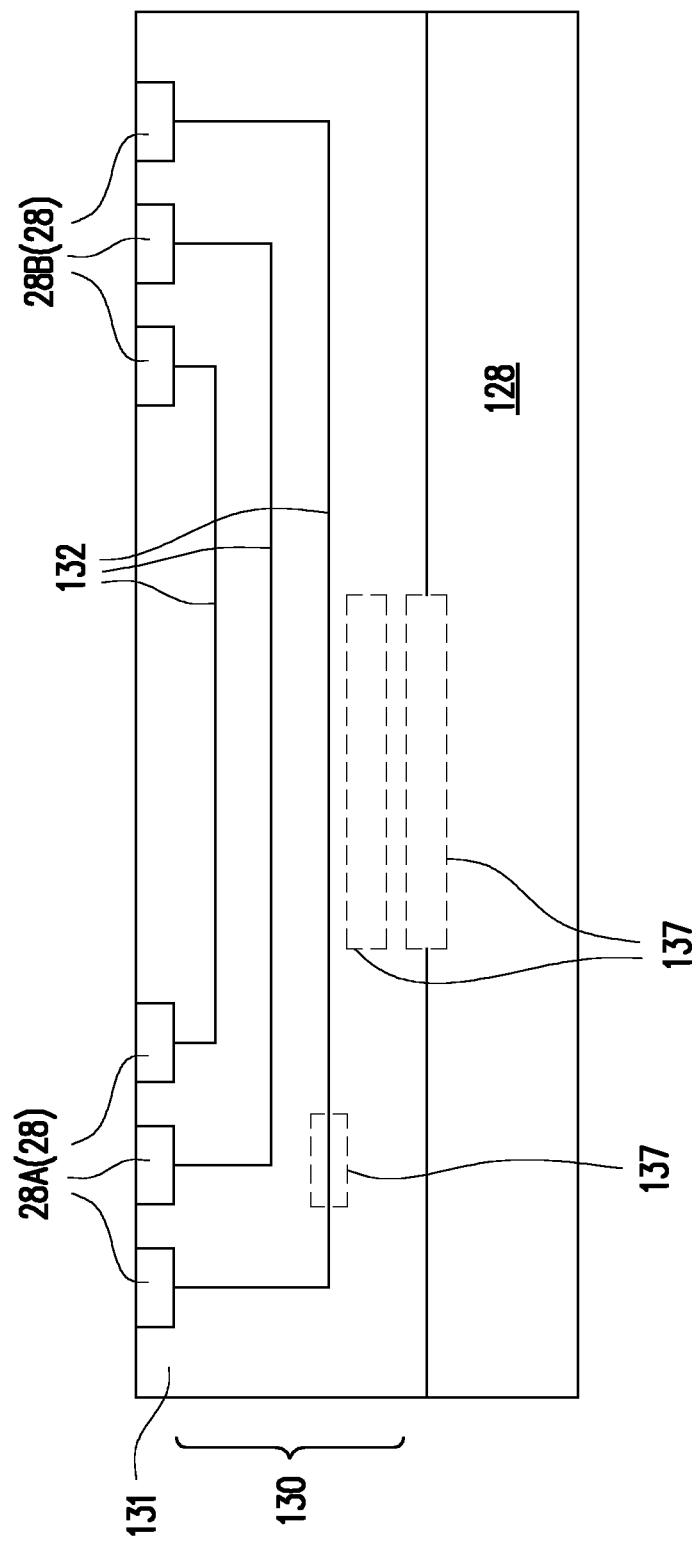
FIG. 22 schematically illustrate a wiring scheme of a bridge die in accordance with some embodiments.

FIG. 22 illustrates a schematic view of a wiring scheme of bridge die 26 in accordance with some embodiments. Bridge die 26 has the function of interconnecting the subsequently bonded package components (such as the illustrated package components 46A and 46B in FIG. 2). In accordance with some embodiments of the present disclosure, bridge die 26 includes substrate 128, which may be a semiconductor substrate such as a silicon substrate, or may be a dielectric substrate formed of, for example, silicon oxide, silicon nitride, or the like. Substrate 128 may also be a dielectric substrate, which is formed of a dielectric material such as silicon oxide, silicon nitride, or the like.

In accordance with some embodiments of the present disclosure, bridge die 26 is free from active devices such as transistors and diodes therein. In accordance with alternative embodiments of the present disclosure, bridge die 26 includes active devices, which may be formed at the top surfaces of semiconductor substrates 128. The respective circuits in bridge die 26 may include memory circuits, logic circuits, and/or the like. In accordance with some embodiments of the present disclosure, bridge die 26 includes passive devices 137 such as capacitors, transformers, inductors, resistors, and/or the like, which are schematically illustrated. In accordance with other embodiments of the present disclosure, bridge die 26 is free from passive devices. Accordingly, passive devices 137 are shown using dashed lines to indicate passive devices 137 may, or may not, exist in bridge die 26. Bridge die 26 may be free from both of active devices and passive devices therein.

Bridge die 26 further include interconnect structure 130, which further includes dielectric layers 131 and metal lines and vias 132 in dielectric layers 131. Dielectric layers 131 may include Inter-Metal Dielectric (IMD) layers. In accordance with some embodiments of the present disclosure, some lower ones of dielectric layers 131 are formed of low-k dielectric materials having dielectric constants (k-values) lower than about 3.0. Dielectric layers 131 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of dielectric layers 131 includes depositing a porogen-containing dielectric material and then performing a curing process to drive out the porogen, and hence the remaining dielectric layers 131 are porous. Etch stop layers (not shown), which may be formed of silicon carbide, silicon nitride, or the like, are formed between IMD layers 131, and are not shown for simplicity.

Metal lines and vias 132 are formed in dielectric layers 131. The formation processes may include single damascene and dual damascene processes. In an example single damascene process, trenches are first formed in one of dielectric layers 131, followed by filling the trenches with a conductive material. A planarization process such as a Chemical Mechanical Polish (CMP) process is then performed to remove the excess portions of the conductive material higher than the top surface of the corresponding dielectric layer, leaving metal lines in the trenches. In a dual damascene process, both trenches and via openings are formed in an IMD layer, with the via openings underlying and connected to the trenches. The conductive material is then filled into the trenches and the via openings to form metal lines and vias, respectively. The conductive material may include a diffusion barrier layer and a copper-containing metallic material over the diffusion barrier layer. The diffusion barrier layer may include titanium, titanium nitride, tantalum, tantalum nitride, or the like. Metal lines and vias 132 may also include some portions formed in passivation layers.

Bridge die 26 may further include passivation layers (also denoted as 131) over the low-k dielectric layers 131. The passivation layers have the function of isolating the underlying low-k dielectric layers (if any) from detrimental chemicals and moisture. The passivation layers may be formed non-low-k dielectric materials such as silicon oxide, silicon nitride, Undoped Silicate Glass (USG), or the like. There may be metal pads such as aluminum pads (which may be formed of aluminum copper, for example) in the passivation layers. Bond pads (or metal pillars) 28 are formed at the surface of bridge die 26. Metal pillars 28 may be formed of copper, aluminum, nickel, palladium, or the like, multi-layers thereof, or alloys thereof.

In accordance with some embodiments of the present disclosure, some of metal pillars 28 are directly connected to other metal pillars 28 through metal lines and vias 132, metal pads, or the like. There may be a plurality of pairs of metal pillars 28, with each of the metal pillars 28 in the pair electrically connecting to another metal pillar 28 in the pair. Throughout the description, one of the pairs of metal pillars 28 is denoted as 28A, while the other one is denoted as 28B. When two metal pillars 28 are interconnected, there may not be any resistor, capacitor, inductor, or the like, connected between the metal pillars 28A and 28B. Accordingly, the metal pillars 28A and 28B in the same pair are electrically shorted to each other. On the other hand, if needed, a passive device 137 (such as a capacitor, a resistor, an inductor, or the like) may also be inserted between metal pillars 28A and 28B in a pair, and the passive device and metal pillars 28A and 28B may be connected in series.

Figure 23:
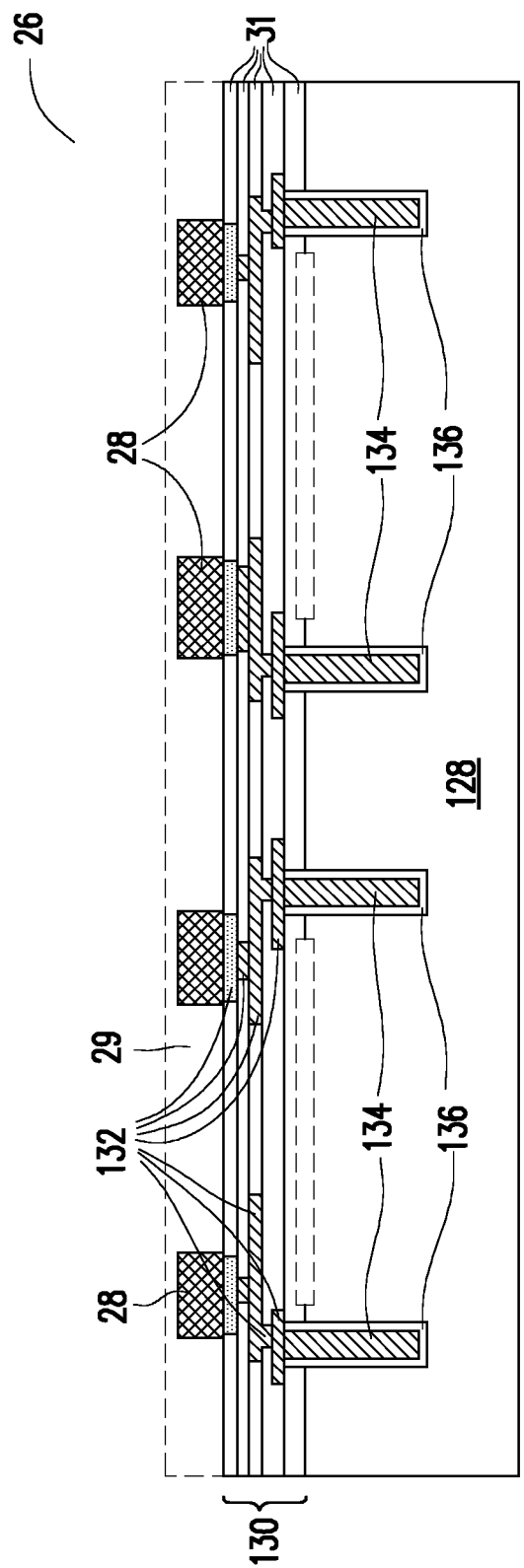
FIGS. 23 and 24 illustrate the cross-sectional views of intermediate stages in the processing of a bridge die including through-vias in accordance with some embodiments.

FIG. 23 illustrates a cross-sectional view of bridge die 26 in accordance with some embodiments of the present disclosure. The wiring scheme of bridge die 26 may be found referring to FIG. 22. The cross-sectional view illustrates the metal lines and vias 132. In accordance with some embodiments, polymer layer 29 (which may be formed of polybenzoxazole (PBO), polyimide, or the like.) may be formed over the metal pillars 28. In accordance with alternative embodiments, no polymer-containing dielectric layer is formed to embed metal pillars 28 therein.

In accordance with some embodiments of the present disclosure, as shown in FIG. 23, TSVs 134 are formed to extend into substrate 128. Each of TSVs 134 may be encircled by an isolation liner 136, which is formed of a dielectric material such as silicon oxide, silicon nitride, or the like. Isolation liners 136 isolate the respective TSVs 134 from semiconductor substrate 128. TSVs 134 and isolation liners 136 extend from a top surface of semiconductor substrate 128 to an intermediate level between the top surface and the bottom surface of semiconductor substrate 128. In accordance with some embodiments, the top surfaces of TSVs 134 are level with the top surface of semiconductor substrate 128. In accordance with alternative embodiments, TSVs 134 extend into one of dielectric layers 131, and extend from a top surface of the corresponding dielectric layer 131 downwardly into semiconductor substrate 128.

In accordance with alternative embodiments of the present disclosure, there is no through-via formed to penetrate through substrate 128, regardless of whether substrate 128 is formed of a semiconductor or a dielectric material. The corresponding bridge die 26 is shown in the embodiments in FIGS. 8 through 18.

Referring back to FIG. 1, when bridge die 26 is placed, other package components, which include, and are not limited to, packages, device dies, Independent Passive Devices (IPDs), or the like, may also be placed through DAFs over release film 22. For example, package component 32 may be placed at a same level as bridge die 26, and placed over release film 22 through DAF 34. In accordance with other embodiments, there is no other package components such as device dies, packages, IPDs, or the like, being placed at the same level as bridge die 26. Accordingly, package component 32 is illustrated using dashed lines to indicate that it may or may not be placed. Package component 32 (if placed) includes metal pillars 36 at its surface. In accordance with some embodiments, package component 32 is or comprises a memory die, a logic die, a package, an IPD, or the like FIG. 1 illustrates that polymer layer 29 is formed in bridge die 26, while no polymer is formed to embed metal pillars 36 therein, as an example. It is appreciated that each of the package components and bridge dies placed over release film 22 may or may not include polymer for embedding the corresponding metal pillars.

Bridge die 26 and package component 32 (if placed) are encapsulated in encapsulant 38, which may be formed of or comprise a molding compound, a molding underfill, an epoxy, a resin, or the like. The respective process is illustrated as process 206 in the process flow shown in FIG. 25. Encapsulant 38 may include a base material, which may be a resin and/or a polymer, and filler particles in the base material. The filler particles may be formed of a dielectric material such as silica or aluminum oxide, which may be spherical particles. After the encapsulation, encapsulant 38 covers bridge die 26 and package component 32. A planarization process is then performed to remove excess portion of encapsulant 38, exposing metal pillars 28 and 36. The planarization process may be a Chemical Mechanical Polish (CMP) process or a mechanical grinding process. In accordance with some embodiments of the present disclosure in which metal pillars 36 are not in a polymer layer, encapsulant 38 flows into the space between metal pillars 36.

FIG. 1 further illustrates the formation of redistribution structure 40, which includes dielectric layers 44 and Redistribution Lines (RDLs) 42. The respective process is illustrated as process 208 in the process flow shown in FIG. 25. In accordance with some embodiments, dielectric layers 44 are formed of polymers such as PBO, polyimide, or the like. The formation method includes coating a dielectric layer 44 in a flowable form, and then curing the corresponding dielectric layer. In accordance with alternative embodiments of the present disclosure, dielectric layers 44 are formed of inorganic dielectric materials such as silicon nitride, silicon oxide, silicon carbide, multi-layers thereof, combinations thereof, or the like. The formation method may include coating, Chemical Vapor Deposition (CVD), Atomic Layer Deposition (ALD), Plasma-Enhanced Chemical Vapor Deposition (PECVD), or other applicable deposition methods.

RDLs 42 include via portions extending into the respective dielectric layers 44, and trace portions over the respective dielectric layers 44. The formation process may include patterning the respective dielectric layer 44 to form openings, forming a blanket metal seed layer (not shown), forming and patterning a plating mask (such as a photo resist) to reveal some portions of the metal seed layer, plating RDLs 42 in the openings in the plating mask, removing the plating mask, and etching the portions of the metal seed layer previously covered by the plating mask. In accordance with some embodiments of the present disclosure, the metal seed layer includes a titanium layer and a copper layer over the titanium layer. The formation of the metal seed layer may include, for example, Physical Vapor Deposition (PVD). In accordance with some embodiments of the present disclosure, the plated material comprises copper, aluminum, aluminum copper, or a copper alloy. The plating may include electro-chemical plating or electro-less plating. Throughout the description, dielectric layers 44 and the RDLs 42 formed therein are in combination referred to as redistribution structure 40. There may be one layer, two layers, or more layers of RDLs 42 formed. RDLs 42 are electrically connected to metal pillars 28 and 36 and through-vias 24. In accordance with some embodiments, bond pads or Under-Bump Metallurgies (UBMs) are formed at the surface of redistribution structure 40, and are also denoted as 42.

Figure 2:
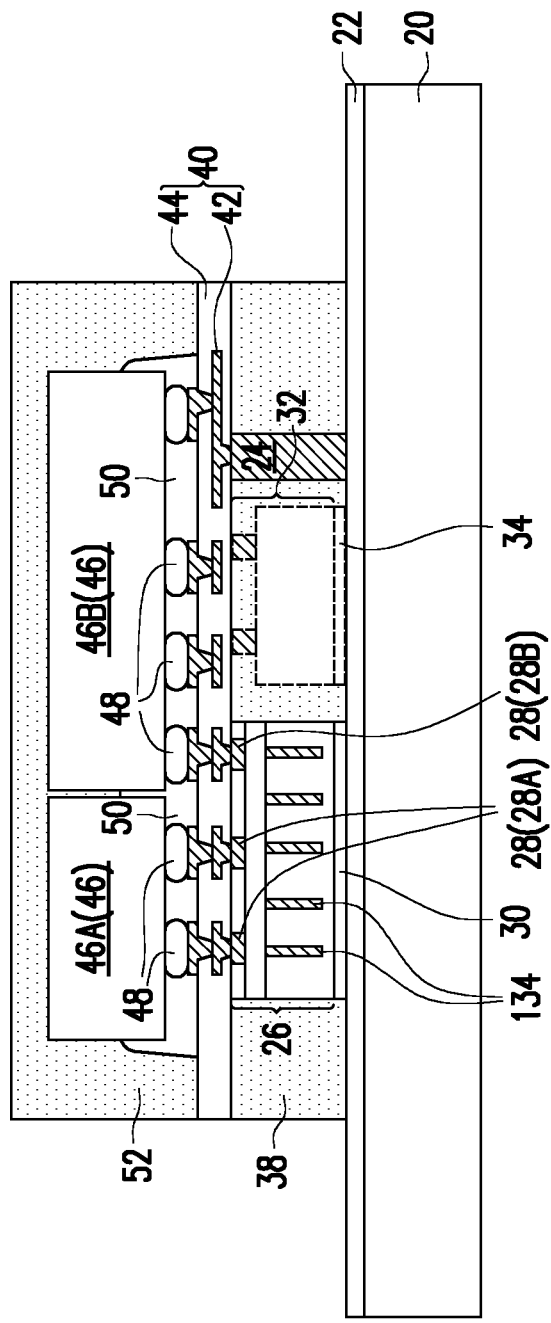

Next, referring to FIG. 2, package components 46 (including 46A and 46B, which are collectively and individually referred to as 46) are bonded to the bond pads of redistribution structure 40, for example, through solder regions 48. The respective process is illustrated as process 210 in the process flow shown in FIG. 25. Each of package components 46A and 46B may be or comprise a logic device die, a memory device die, a memory stack (such as High Bandwidth Memory (HBM) stack), an IPD, or the like.

In accordance with some embodiments, both of package components 46A and 46B are electrically connected to the same bridge die 26, and are interconnected through the electrical paths in bridge die 26 and RDLs 42. For example, as shown in FIG. 22, bridge die 26 includes a plurality of pairs of metal pillars 28A and 28B, with the metal pillar 28A and metal pillar 28B in the same pair being electrically connected. The metal pillars 28A may be directly connected to the bond pads in package component 46A through the overlying RDLs 42, and the metal pillars 28B may be directly connected to the bond pads in package component 46B through the overlying RDLs 42. Accordingly, FIGS. 2 and 22 in combination show that bridge die 26 electrically interconnects package components 46A and 46B. An advantageous feature of using bridge die 26 (rather than use RDLs 42 only) to interconnect package components 46A and 46B is that the metal lines and vias in bridge die 26 may be formed using the same technology for forming device dies, which includes, for example, damascene processes. Accordingly, since the pitch and the line width of RDLs 42 are significantly greater than that in bridge die 26, by using bridge die 26, the wire pitch and the wire length of the intersection may be very small, and the total number of available interconnections is significantly more than using RDLs 42 only to perform the interconnection. In accordance with some embodiments, the RDLs 42 within the connection paths of package components 46A and 46B are used for vertical connections from package components 46A and 46B to the underlying metal pillars 28, and these RDLs 42 do not have horizontal routing function. Accordingly, all electrical paths that interconnect the package component 46A and 46B pass through the bridge die. In accordance with some embodiments of the present disclosure, some of the electrical paths that interconnect the package component 46A and 46B pass through RDLs 42 without going through bridge die 26, while other electrical paths going through bridge die 26. Also, some of the bond pads in package component 46A and/or some of the bond pads in package component 46B may be electrically connected to through-vias 134.

After the bonding, underfill 50 is dispensed between package components 46 and redistribution structure 40, and is then cured. Encapsulant 52 such as a molding compound is then encapsulated on package components 46A and 46B. The respective process is illustrated as process 212 in the process flow shown in FIG. 25. In accordance with some embodiments, instead of applying underfill 50 and encapsulant 52 separately, a molding underfill is applied and cured. After the encapsulating process, a planarization process such as a Chemical Mechanical Polish (CMP) process is performed. The planarization process may be performed when there is still a layer of encapsulant 52 covering package components 46A and 46B. Leaving some encapsulant 52 over package components 46A and 46B may keep the resulting package thick enough for the subsequent processes, and may keep the back surfaces of package components 46A and 46B protected in the processes shown in FIGS. 3 and 4.

Figure 3:
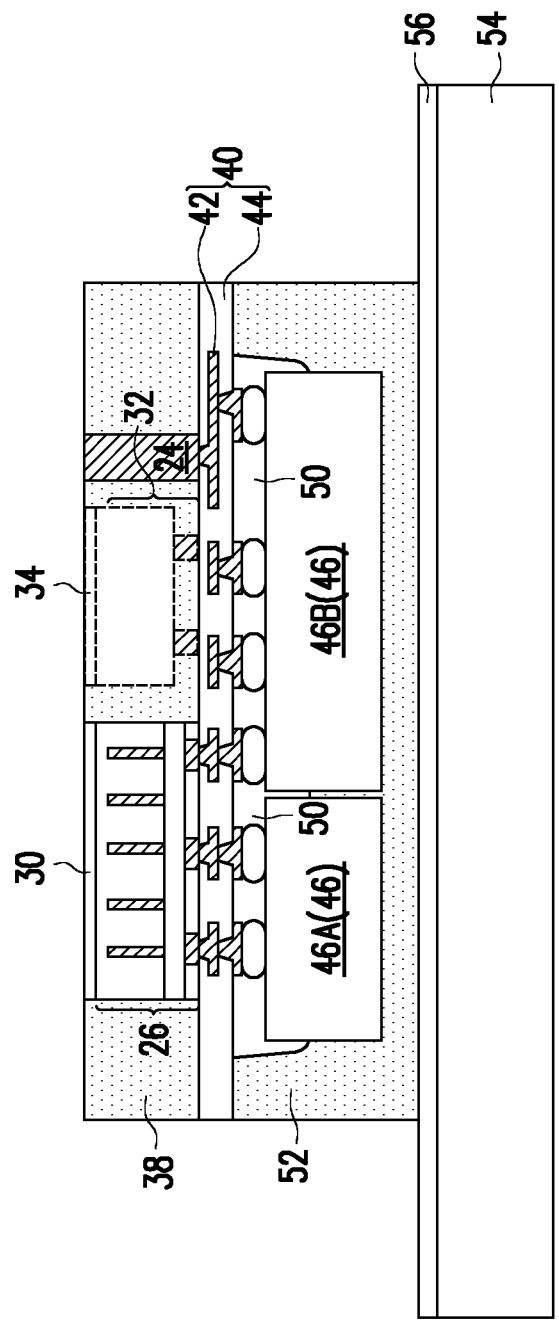

A carrier switch is then performed, in which the package as shown in FIG. 2 is attached to carrier 54 through release film 56, which are shown in FIG. 3. The respective process is illustrated as process 214 in the process flow shown in FIG. 25. Carrier 20 is then de-bonded from the overlying structure, for example, by projecting radiation (such as a laser beam) on release film 22 (FIG. 2), so that release film 22 is decomposed, hence releasing carrier 20. The resulting structure is shown in FIG. 3.

Figure 24:
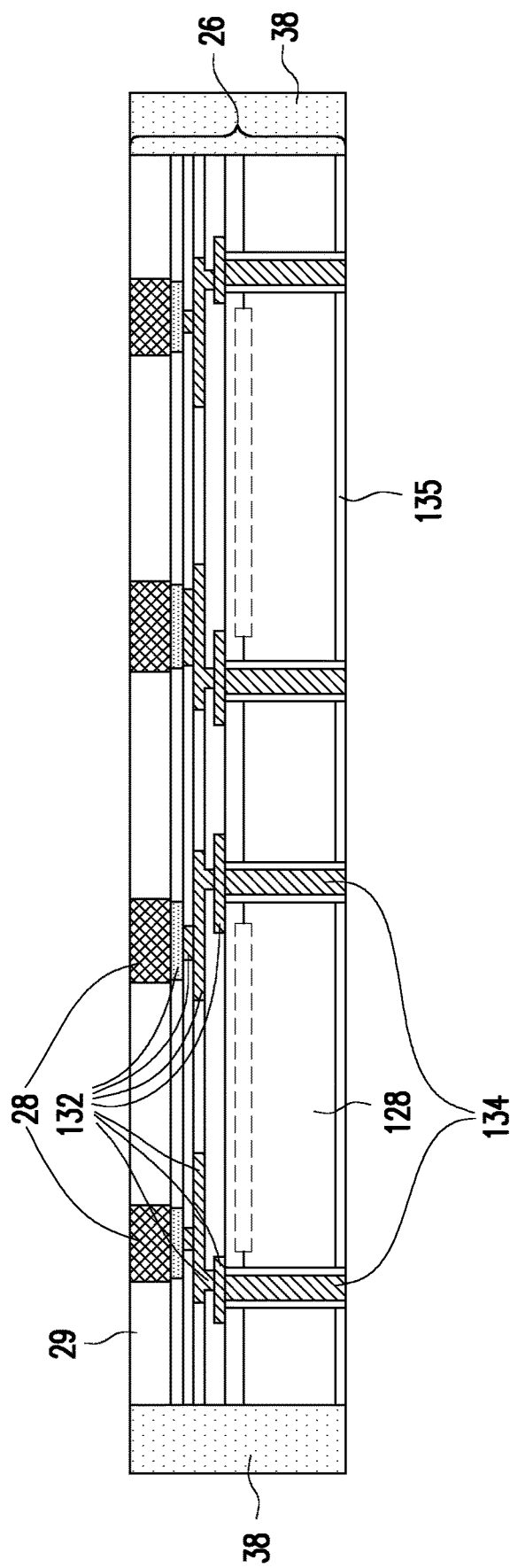

In a subsequent process, a thinning process is performed to remove DAF 30, the portions of substrate 128 underlying through-vias 134, and isolation liners 136 (FIG. 23), until the ends of through-vias 134 are revealed. The corresponding portions of encapsulant 38 and through-vias 24 (FIG. 3) are also polished. A dielectric layer may be (or may not be) formed to cover the exposed substrate 128, and the details of the respective portions of bridge die 26 and encapsulant 38 are shown in FIG. 24, with the dielectric layer 135 being illustrated. The resulting structure is also shown in FIG. 4.

Figure 4:
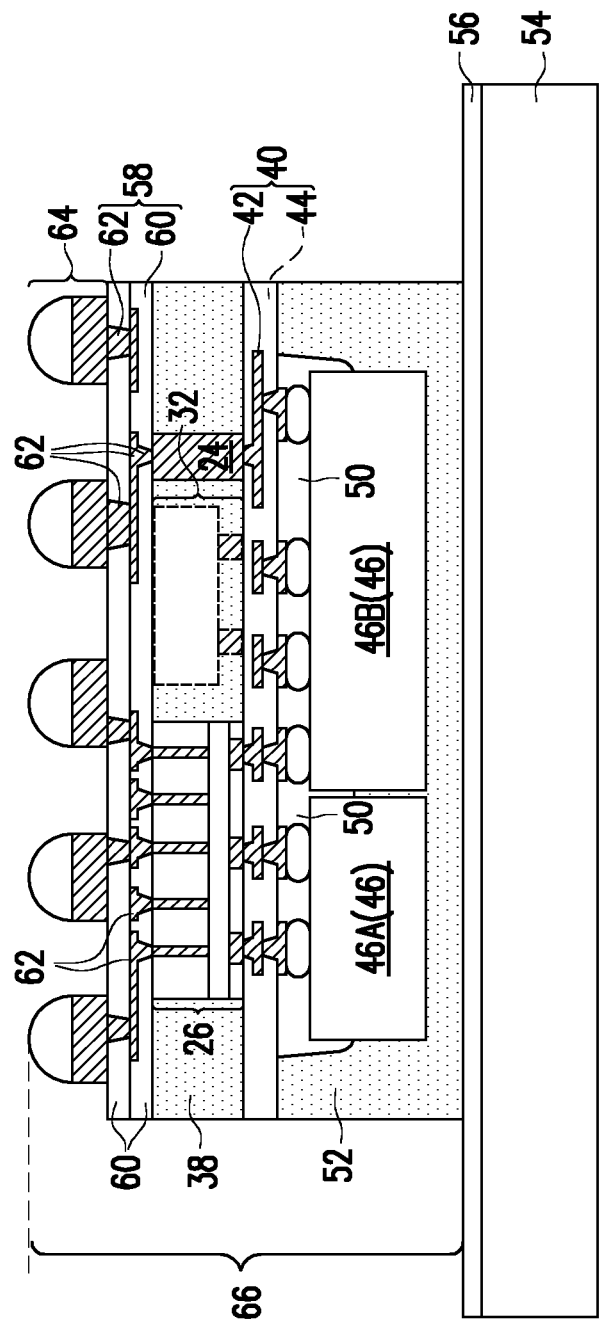

FIG. 4 also illustrates the formation of redistribution structure 58, which includes dielectric layers 60 and RDLs 62. The respective process is illustrated as process 216 in the process flow shown in FIG. 25. The formation process and the candidate materials of dielectric layers 60 and RDLs 62 are similar to that of dielectric layers 44 and RDLs 42, and hence the details are not repeated herein. Electrical connectors 64 are then formed over and electrically connecting to RDLs 62. The respective process is also illustrated as process 216 in the process flow shown in FIG. 25. Electrical connectors 64 may include metal pillars and pre-solder regions on the metal pillars, or may include solder regions contacting RDLs 62. Throughout the description, the features over release film 56 are collectively referred to as reconstructed wafer 66.

Figure 5:
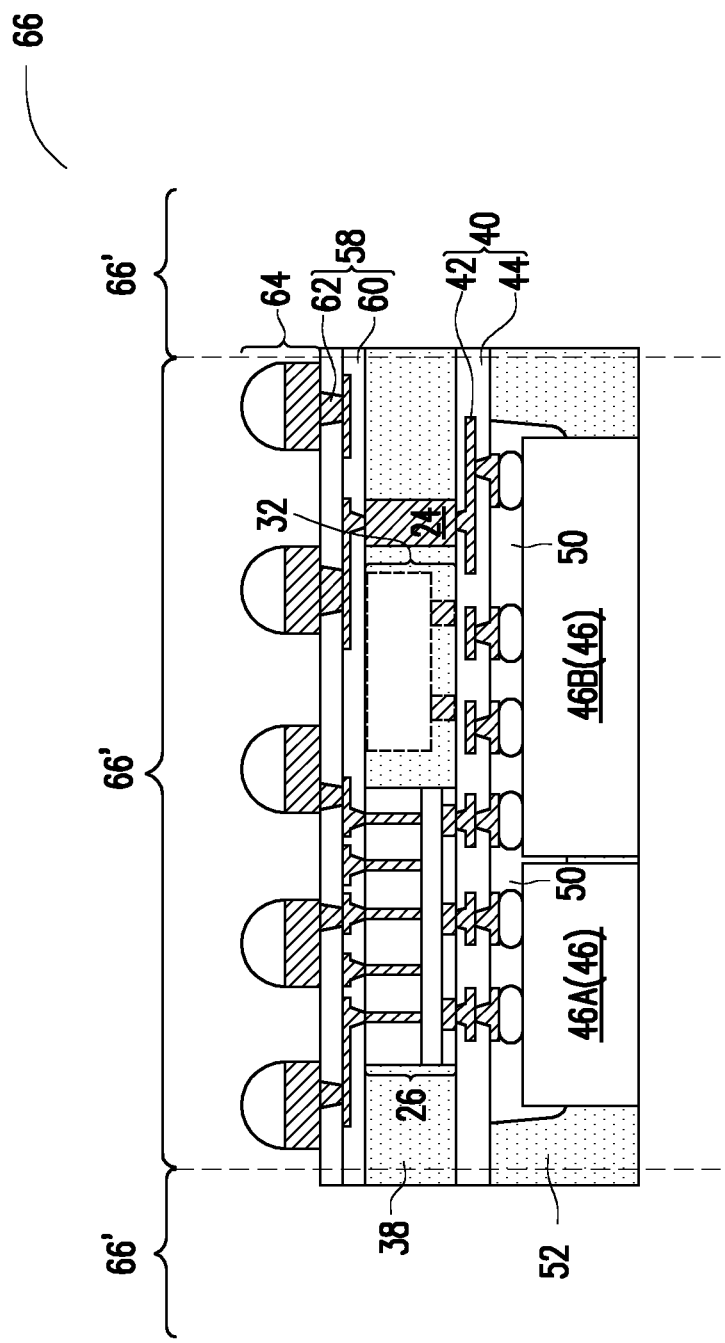

Carrier 54 is then de-bonded from the reconstructed wafer 66, for example, by projecting a radiation (such as a laser beam) on release film 56, so that release film 56 is decomposed, releasing carrier 54. The respective process is illustrated as process 218 in the process flow shown in FIG. 25. The resulting reconstructed wafer 66 is shown in FIG. 5. In a subsequent process, a singulation process (such as a sawing process) is performed to separate reconstructed wafer 66 into a plurality of packages 66'. The respective process is illustrated as process 220 in the process flow shown in FIG. 25.

Figure 6:
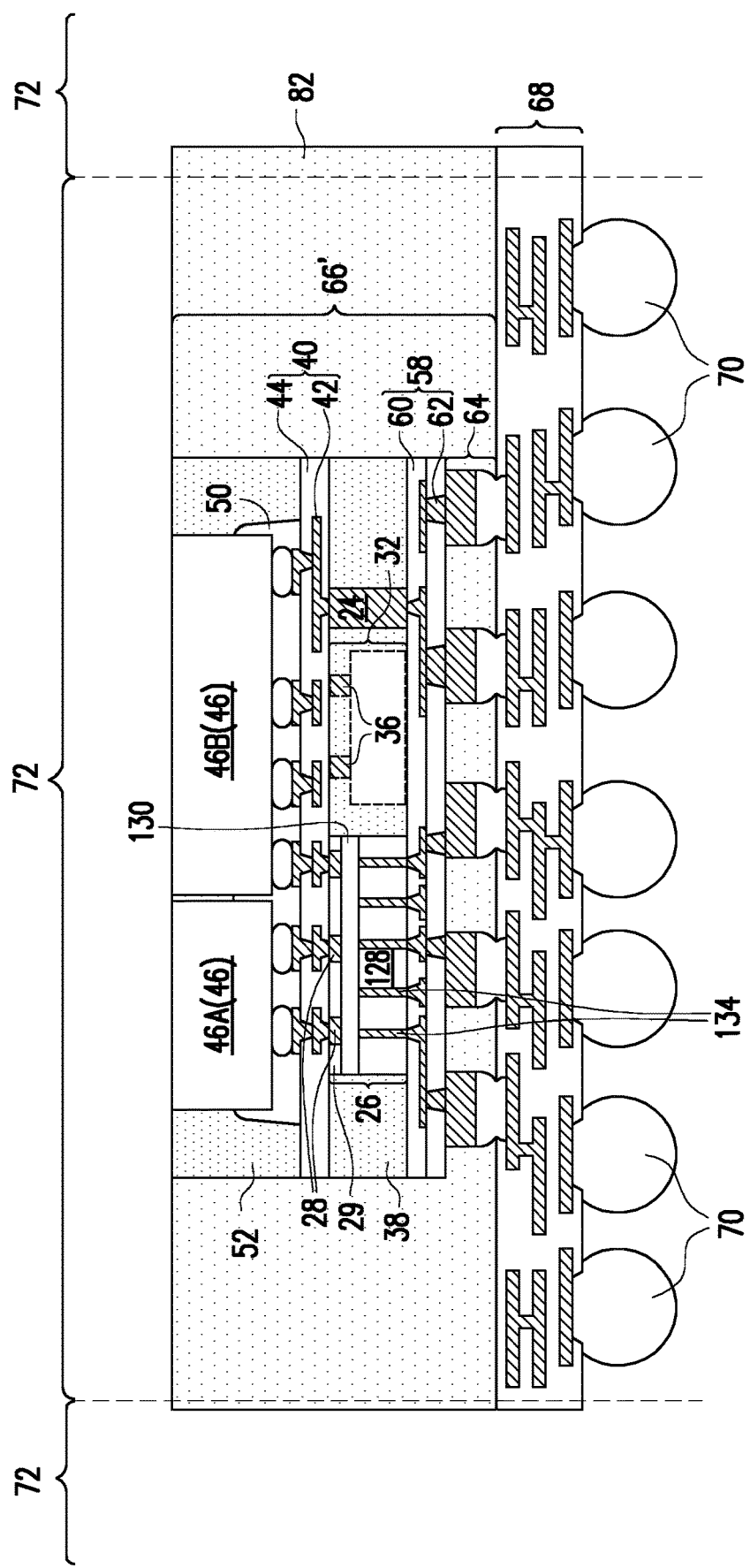

Referring to FIG. 6, package 66' is bonded to package substrate 68, for example, through solder bonding. The respective process is illustrated as process 222 in the process flow shown in FIG. 25. In accordance with some embodiments of the present disclosure, a plurality of packages 66' are bonded to a plurality of package substrates 68, which are integrated parts of a package substrate strip. Package substrate 68 may be a coreless substrate or a cored substrate. Solder regions 70 may be formed at the bottom of substrate 68. Solder regions 70 may be electrically connected to through-vias 24 and 134, and may be electrically connected to package components 46. Encapsulant 82 is dispensed and then cured to encapsulate package 66' therein. Encapsulant 82 may comprise molding compound, molding underfill, or the like. A singulation process is then performed to singulate the respective structure and form a plurality of packages 72. The respective process is also illustrated as process 224 in the process flow shown in FIG. 25.

Figure 7:
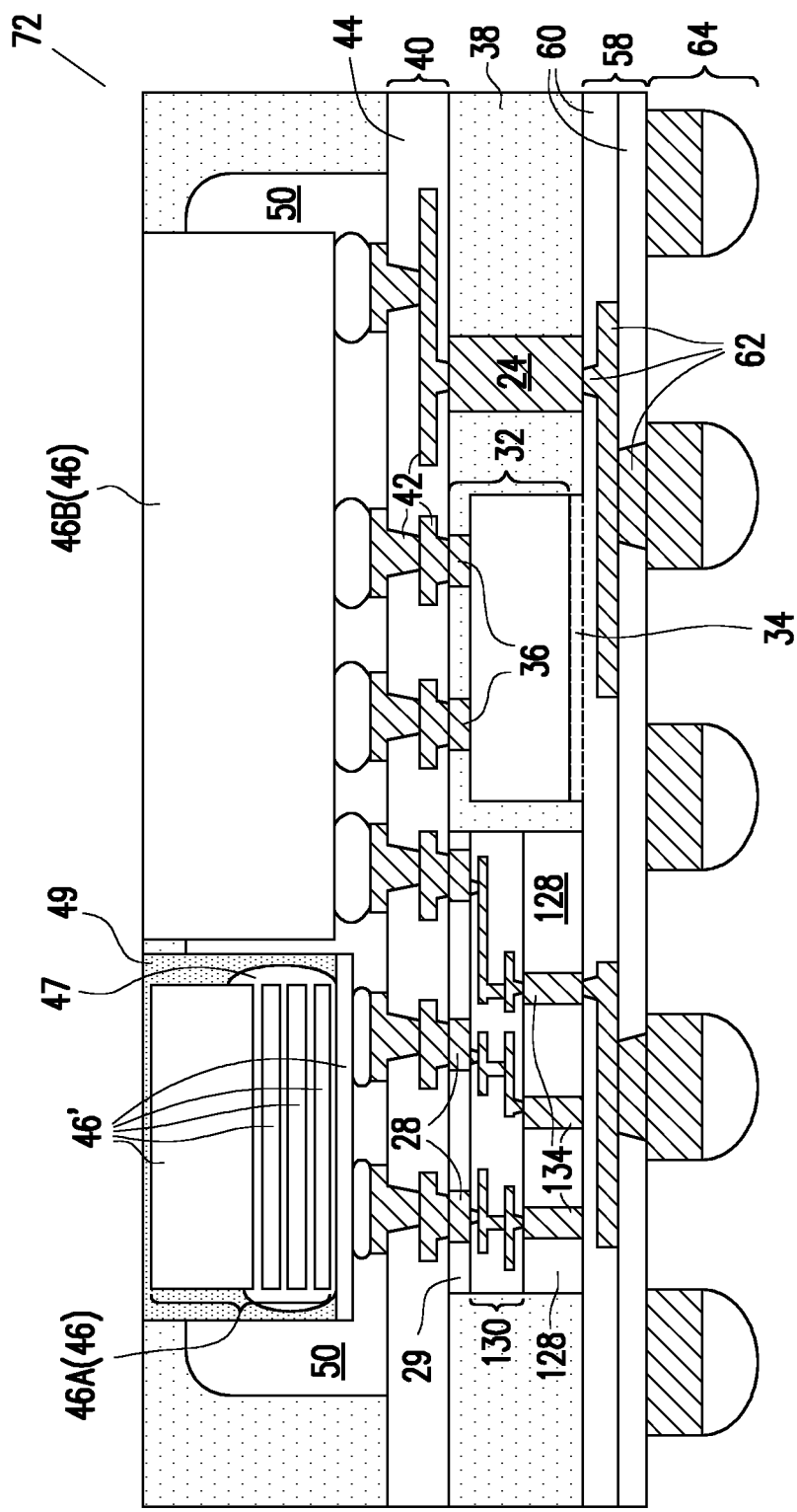

FIG. 7 illustrates package 72 in accordance with some embodiments, in which DAF 34 may have a portion left in the final package 72. In accordance with some embodiments, in the structure shown in FIG. 1, package component 32 is thinner than bridge die 26, and DAF 34 is thicker than DAF 30. Accordingly, after the thinning process as performed on the structure shown in FIG. 2, DAF 34 has some portions left, as shown in FIG. 7. FIG. 7 also illustrates that package component 46A is a memory stack including a plurality of memory dies 46' therein. Underfill 47 may be formed between the plurality of memory dies 46', and encapsulant 49 further encapsulates memory dies 46' therein.

As shown in FIGS. 6 and 7, through-vias 24 penetrate through encapsulant 38. In the same package, through-vias 134 penetrate through substrate 128 of bridge die 26. Both of through-vias 24 and 134 have the function of interconnecting RDLs 42 and 62. It is appreciated that through-vias 24 may occupy a relatively small chip area in package 72, and routing a signal from an RDL 42 far away from bridge die 26 means the routing path is long. Accordingly, through-vias 24 are used to shorten the routing paths.

FIGS. 8 through 12 illustrate cross-sectional views of intermediate stages in the formation of a package in accordance with some embodiments of the present disclosure. These embodiments are similar to the embodiments shown in FIGS. 1 through 7, except that IPDs are bonded to redistribution structure 40, and that bridge die 26 does not have through-vias therein. Unless specified otherwise, the materials and the formation processes of the components in these embodiments are essentially the same as the like components, which are denoted by like reference numerals in the preceding embodiments shown in FIGS. 1 through 7. The details regarding the formation process and the materials of the components shown in FIGS. 8 through 12 (and FIGS. 13 through 18) may thus be found in the discussion of the preceding embodiments.

Figure 8:
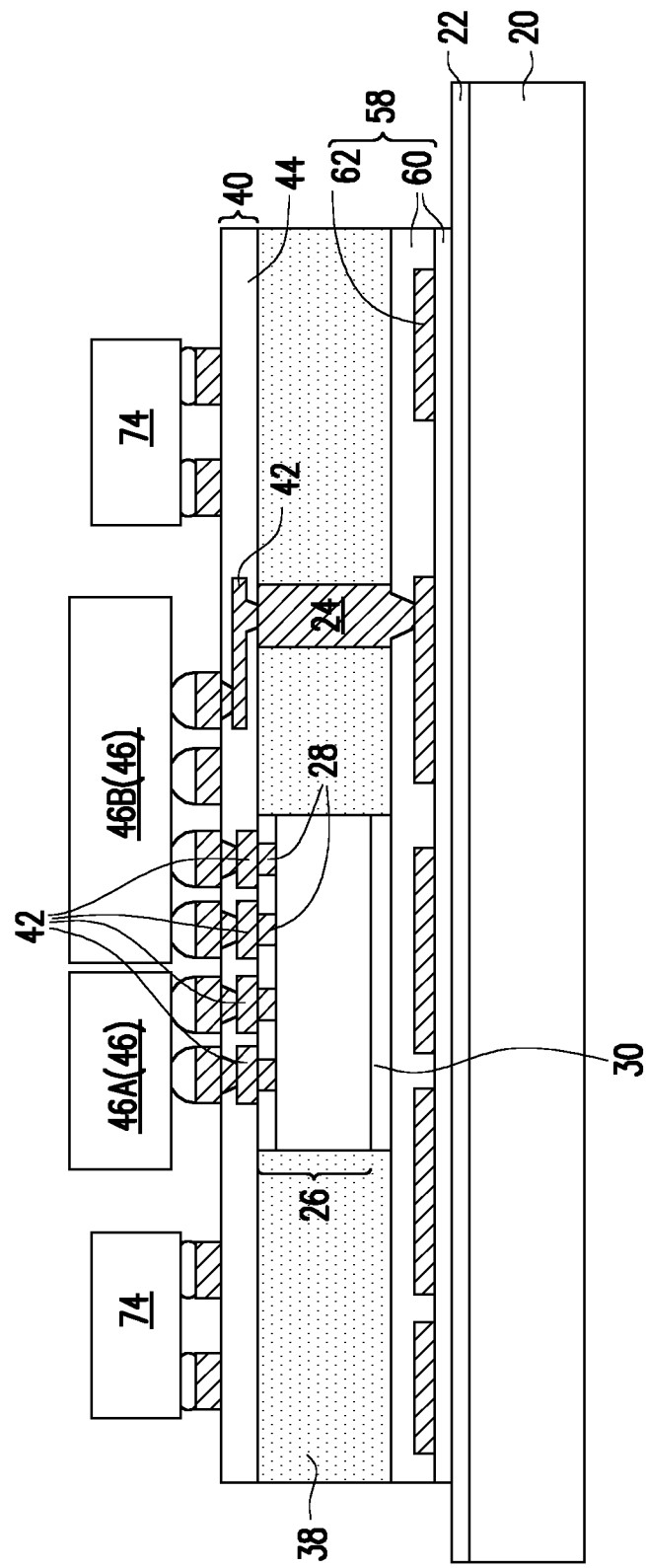
FIGS. 8 through 12 illustrate the cross-sectional views of intermediate stages in the formation of a package including a bridge die in accordance with some embodiments.

Referring to FIG. 8, redistribution structure 58 is first formed on release film 22, which is over carrier 20. Redistribution structure 58 includes dielectric layers 60 and redistribution lines 62. Through-vias 24 are formed over redistribution structure 58. Bridge die 26 is placed over release film 22 using DAF 30. Bridge die 26 may have essentially the same structure as that shown in FIGS. 22 and 23, except that the through-vias 134 as shown in FIG. 23 are not formed. Next, encapsulant 38 is planarized in a planarization process, followed by the formation of redistribution structure 40. In a subsequent process, package components 46A and 46B are bonded to redistribution structure 40, for example, through solder bonding. Package components 46A and 46B are interconnected to each other through RDLs 42 and bridge die 26 also.

Figure 12:
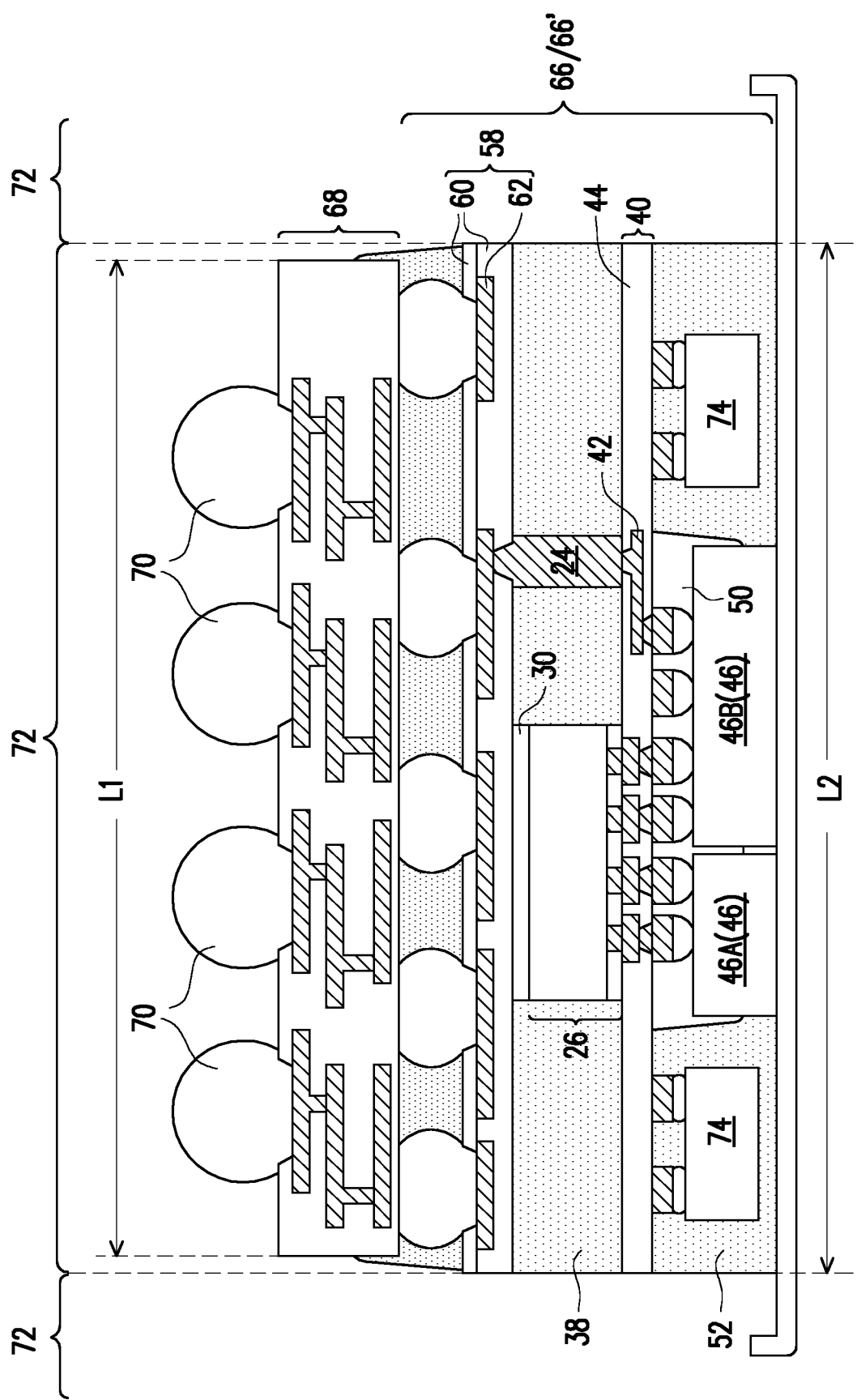

IPDs 74 are bonded to the surface of redistribution structure 40, for example, through solder bonding. IPDs 74 may include capacitors, inductors, resistors, or the like. In accordance with some embodiments of the present disclosure, some or all of IPDs 74 may be discrete IPD dies, which may be free from active devices therein. Some of IPD dies 74 may only include a single passive device therein. Bonding IPDs 74 to redistribution structure 40 is different from in conventional bonding scheme, in which IPDs are bonded to package substrates, for example, the package substrate 68 as shown in FIG. 12. Bonding IPD dies 74 to redistribution structure 40 results in the effective usage of chip area, and the size of the package substrate may be reduced, resulting in the footprint of the resulting package to be reduced.

Figure 9:
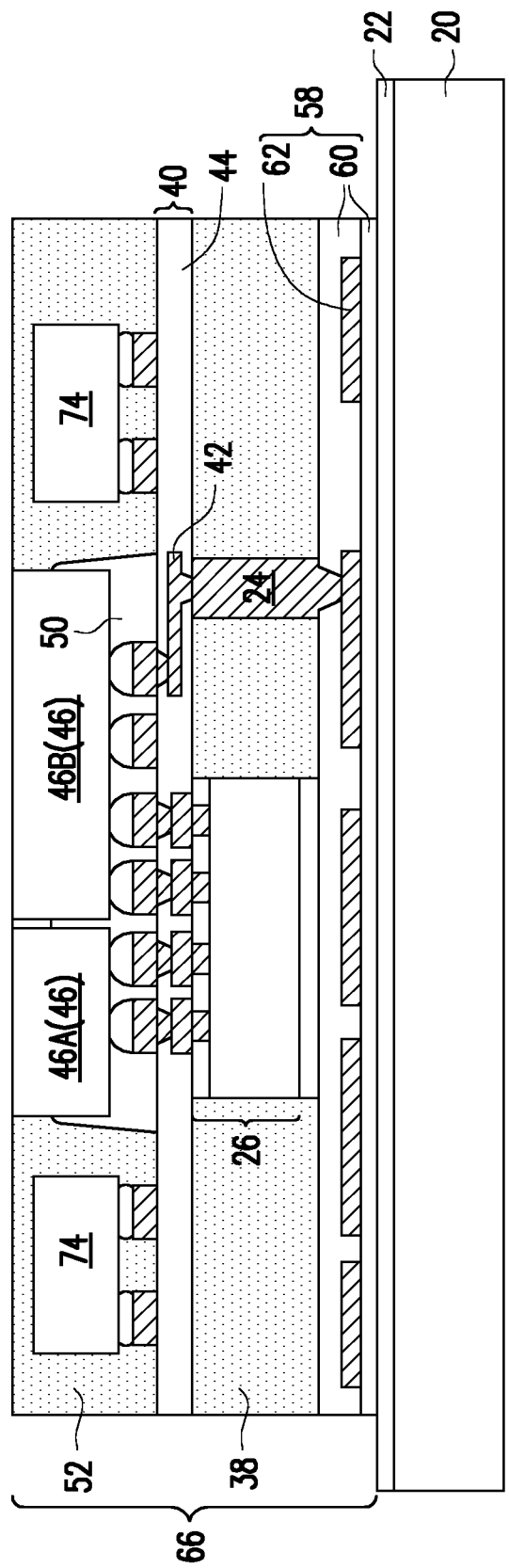

Referring to FIG. 9, underfill 50 is dispensed, and package components 46 and IPDs 74 are encapsulated in encapsulant 52. Encapsulant 52 is then planarized until the top surfaces of package components 46 are exposed. Reconstructed wafer 66 is thus formed. Next, a de-bonding process is performed, and reconstructed wafer 66 is de-bonded from carrier 20.

Figure 10:
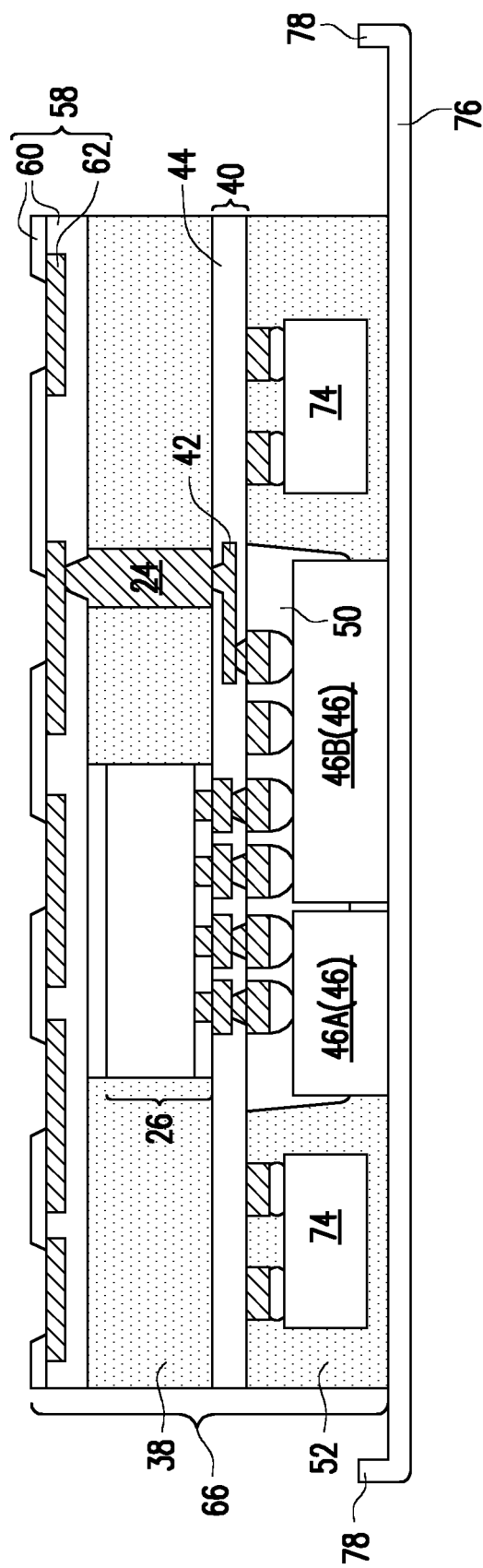
Figure 11:
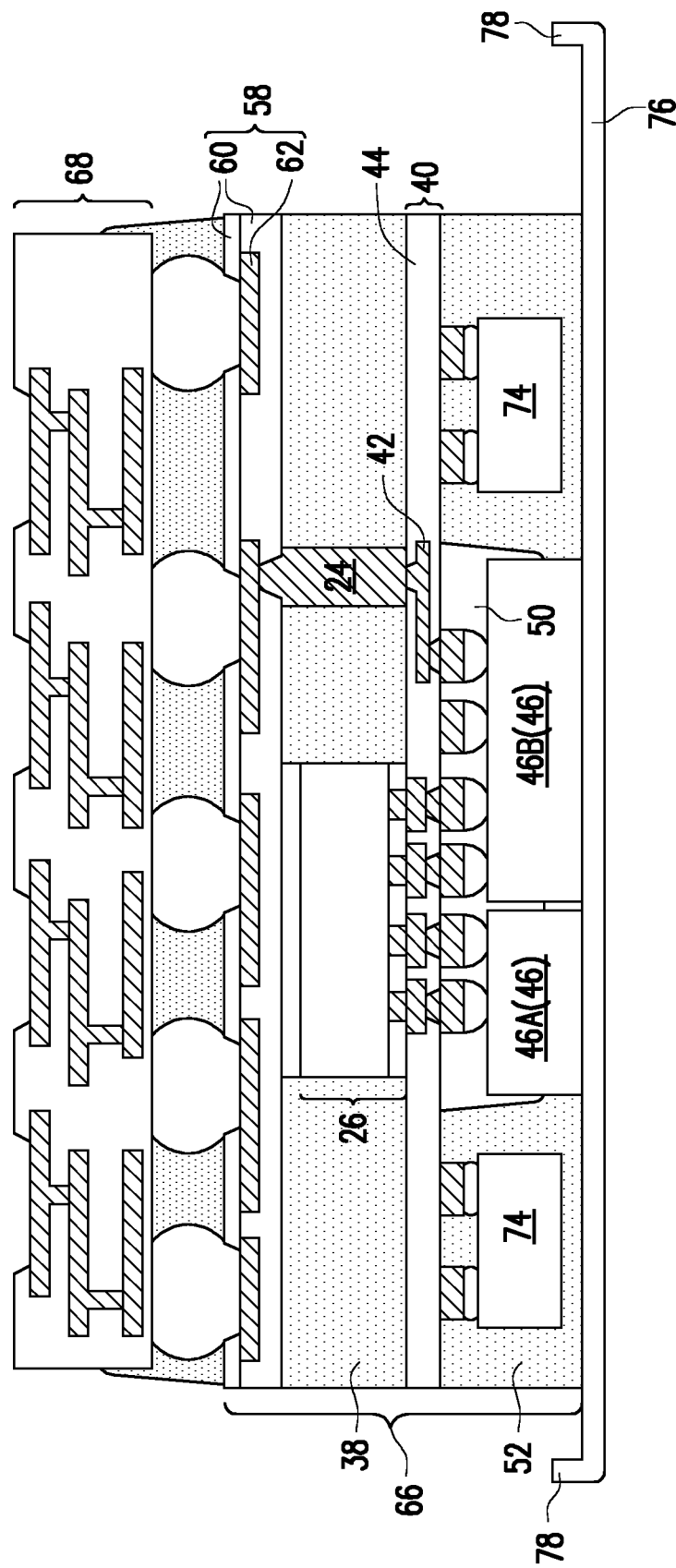

FIG. 10 illustrates the placement of reconstructed wafer 66 on tape 76, which is fixed on frame 78. A dielectric layer 60 in redistribution structure 58 is now the top surface layer, which is then patterned, for example, in a laser drill process or an etching process to reveal some bond pads in RDLs 62. In FIG. 11, package substrate 68 is bonded to reconstructed wafer 66, for example, through solder regions. Although one package substrate 68 is illustrated, there are a plurality of identical package substrates 68 bonded to reconstructed wafer 66. This process is different from conventional processes, in which packages are singulated first as discrete packages, and the discrete packages are bonded to an integrated package substrates strip, which includes a plurality of package substrates.

FIG. 12 illustrates the formation of electrical connectors 70 on package substrate 68. A singulation process is then performed to saw reconstructed wafer 66 into a plurality of discrete packages 72. Reconstructed wafer 66 is also singulated as packages 66'. Each of discrete packages 72 includes the package components 46A and 46B, bridge die 26, and package substrate 68.

As shown in FIG. 12, IPDs 74, instead of being bonded to package substrate 68, is bonded to redistribution structure 40. This makes it possible to singulate package substrates and then bonds the singulated package substrates to the (wafer-level) reconstructed wafer 66. As a result, the size of package substrate 68 may be reduced to the same or smaller than that of package 66'. Also, IPDs 74 are bonded to redistribution structure 40, rather than on package substrate 68, further making it possible to reduce the size of package substrate 68. For example, length L1 (or width) of package substrate 68 may be equal to or smaller than length L2 (or width) of package 66'. This is different from conventional packages in which package substrates are larger than the packages bonded to them because the packages are discrete packages, and are bonded to an integrated package substrate strip that include a plurality of package substrates.

FIGS. 13 through 18 illustrate the formation of package 72 in accordance with alternative embodiments. These embodiments are similar to the embodiments in FIGS. 8 through 12, except that no IPDs 74 are bonded. Also, different from the embodiments as shown in FIGS. 8 through 12, in the embodiments in FIGS. 13 through 18, discrete packages 66' are formed first, and are then bonded to a package substrate strip. The processes are discussed briefly as follows.

Figure 13:
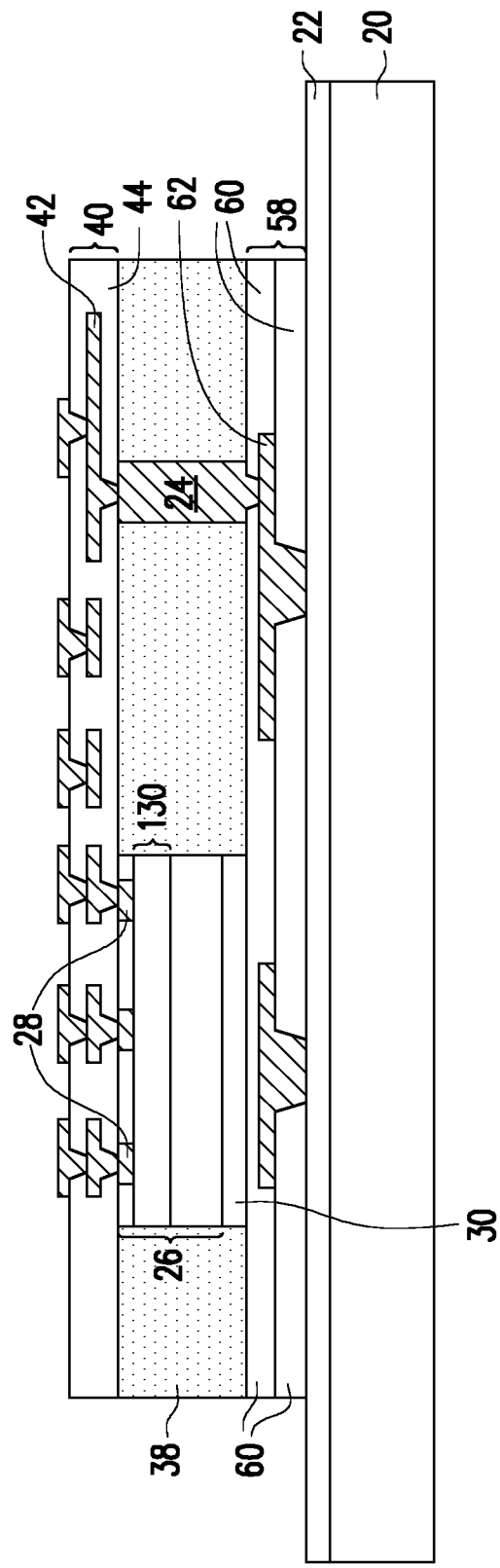
FIGS. 13 through 18 illustrate the cross-sectional views of intermediate stages in the formation of a package including a bridge die in accordance with some embodiments.

Referring to FIG. 13, redistribution structure 58 is formed over carrier 20 and release film 22. Redistribution structure 58 includes dielectric layers 60 and RDLs 62 extending into dielectric layers 60. The formation processes and the materials may be selected from the candidate formation processes and materials for forming dielectric layers 44 and RDLs 42, respectively, as shown in FIG. 1. Next, through-vias 24 are formed over redistribution structure 58, and are electrically connected to RDLs 62. Bridge die 26 is placed over redistribution structure 58 through DAF 30. Through-vias 24 and bridge die 26 are then encapsulated in encapsulant 38. Redistribution structure 40 is then formed. The RDLs 42 in redistribution structure 40 are electrically connected to bridge die 26 and through-vias 24.

Figure 14:
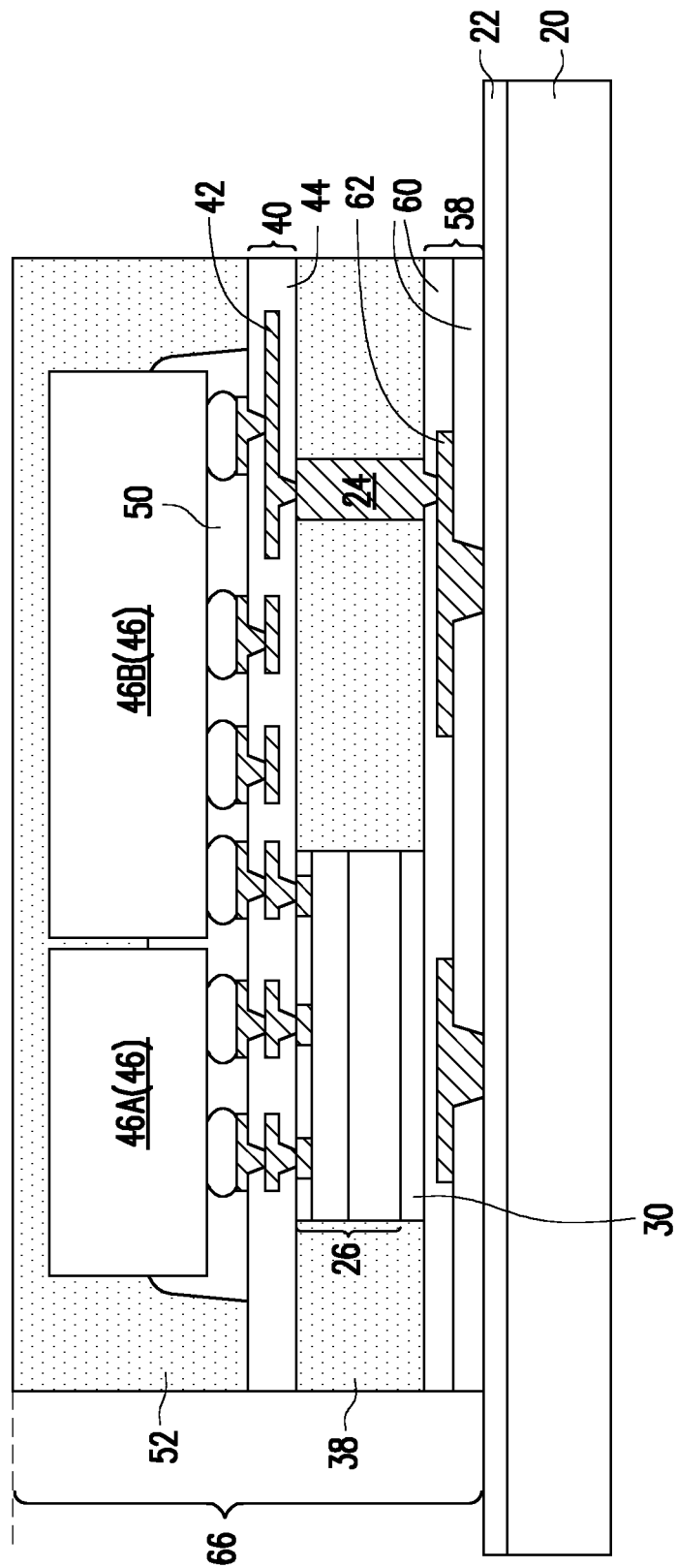

Referring to FIG. 14, package components 46A and 46B are bonded to redistribution structure 40, for example, through solder bonding. Package components 46A and 46B are interconnected to each other through RDLs 42 and bridge die 26 also. Underfill 50 is dispensed, and package components 46A and 46B are encapsulated in encapsulant 52. Encapsulant 52 is then planarized. In accordance with some embodiments, after the planarization, package components 46 are still covered by some encapsulant 52. In accordance with alternative embodiments, the back surfaces of at least one, and possibly both, of package components 46A and 46B are exposed. Reconstructed wafer 66 is thus formed. Next, a de-bonding process is performed, and reconstructed wafer 66 is de-bonded from carrier 20.

Figure 15:
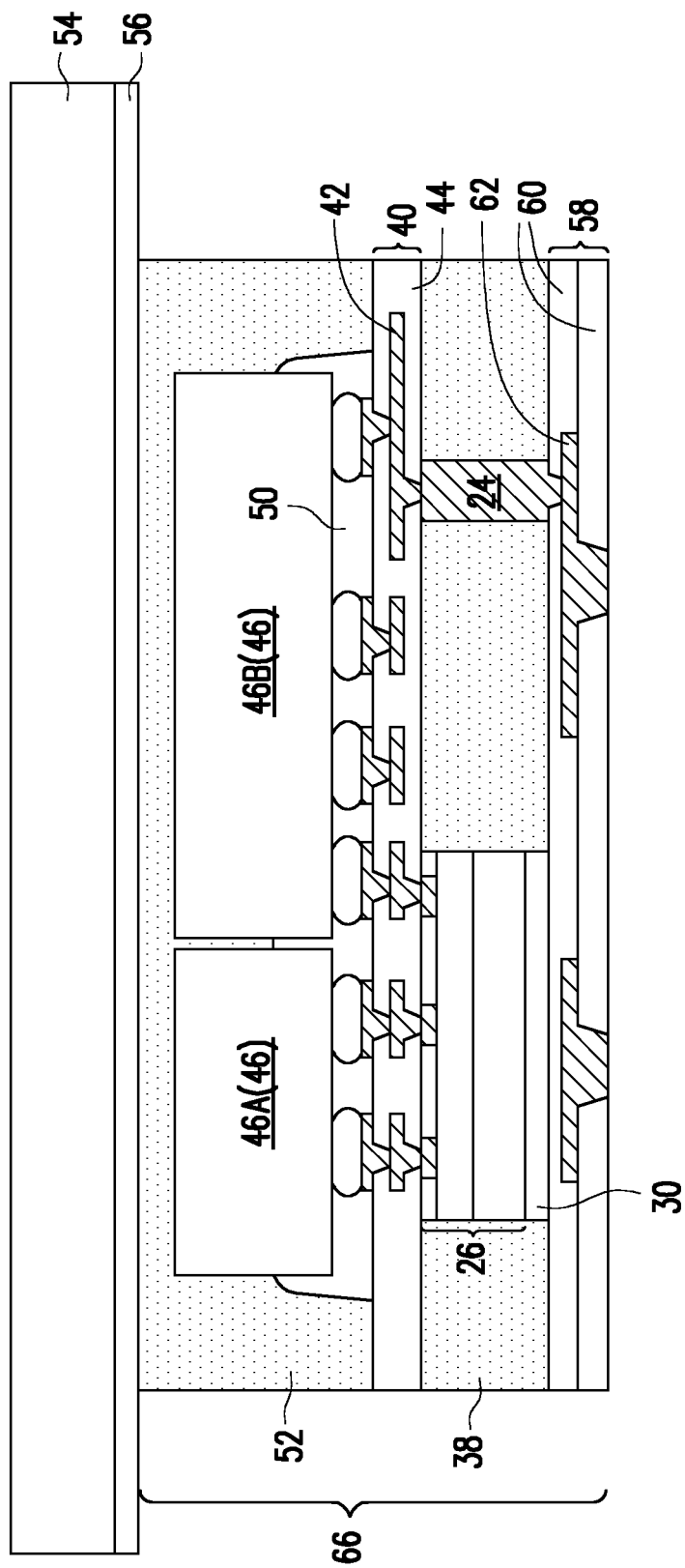
Figure 16:
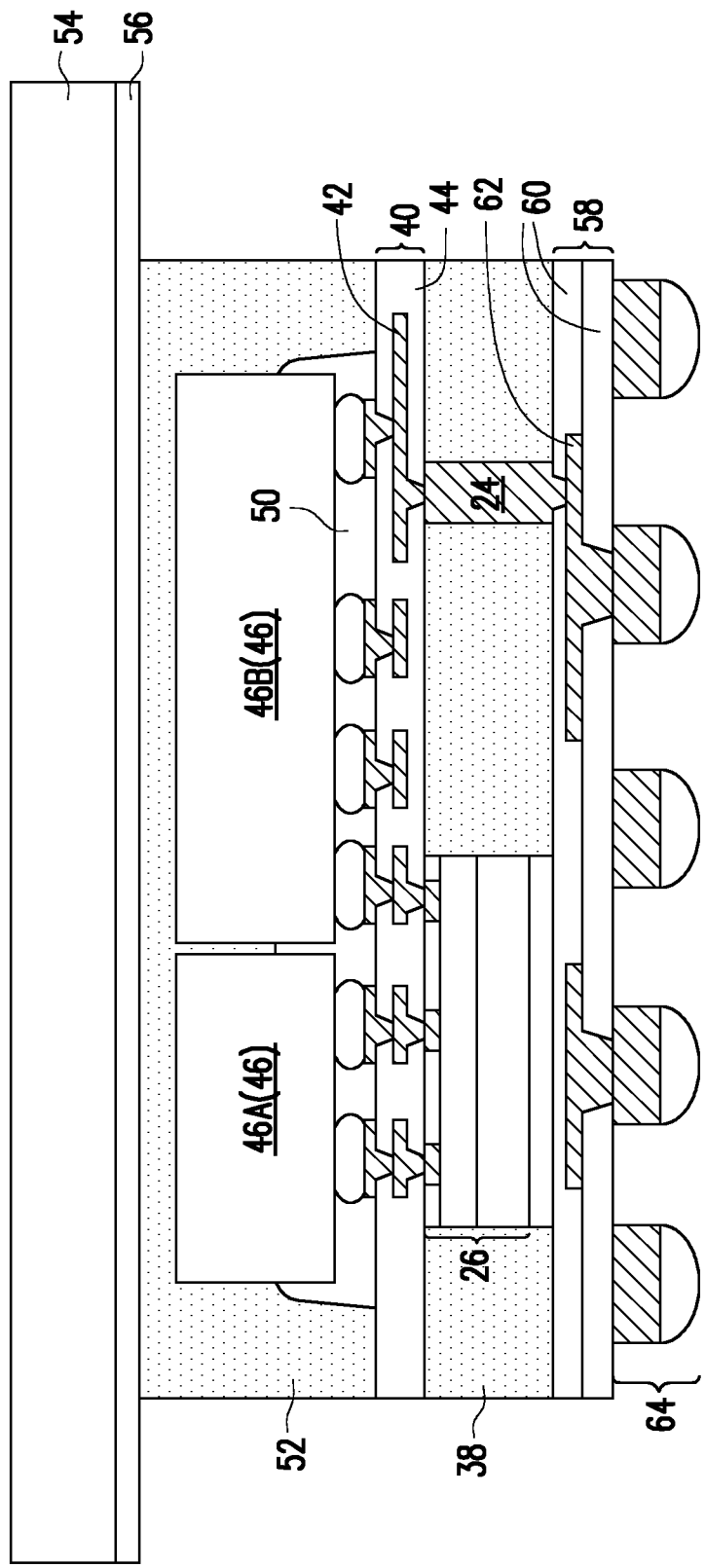
Figure 17:
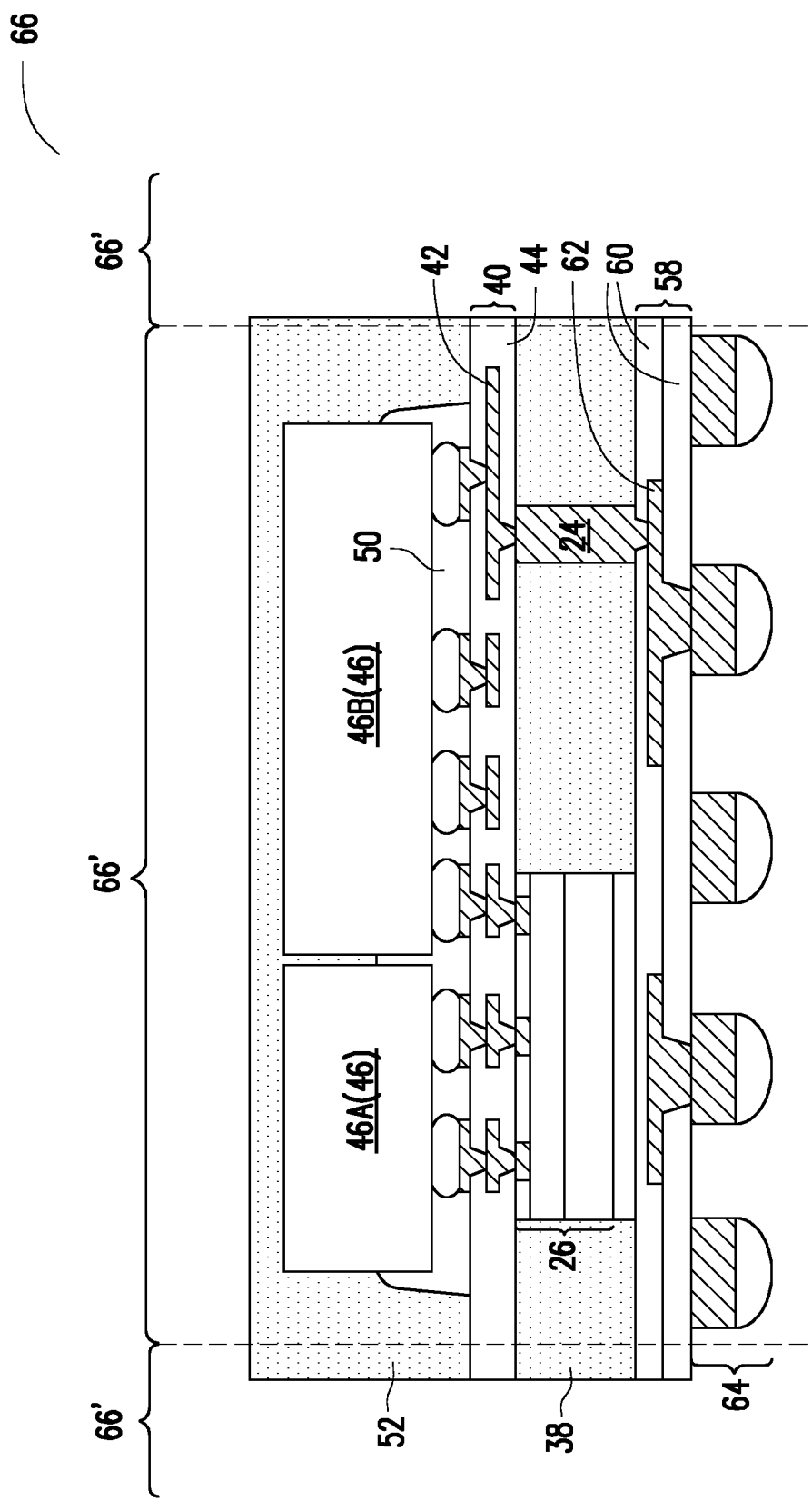

FIG. 15 illustrates a carrier switch process, with the carrier 20 as shown in FIG. 14 being de-bonded, and reconstructed wafer 66 is attached to carrier 54 through release film 56. In a subsequent process as shown in FIG. 16, electrical connectors 64 are formed. Reconstructed wafer 66 is then de-bonded from carrier 54, and the resulting reconstructed wafer 66 is shown in FIG. 17. A singulation is then performed to singulate reconstructed wafer 66 as packages 66'.

Figure 18:
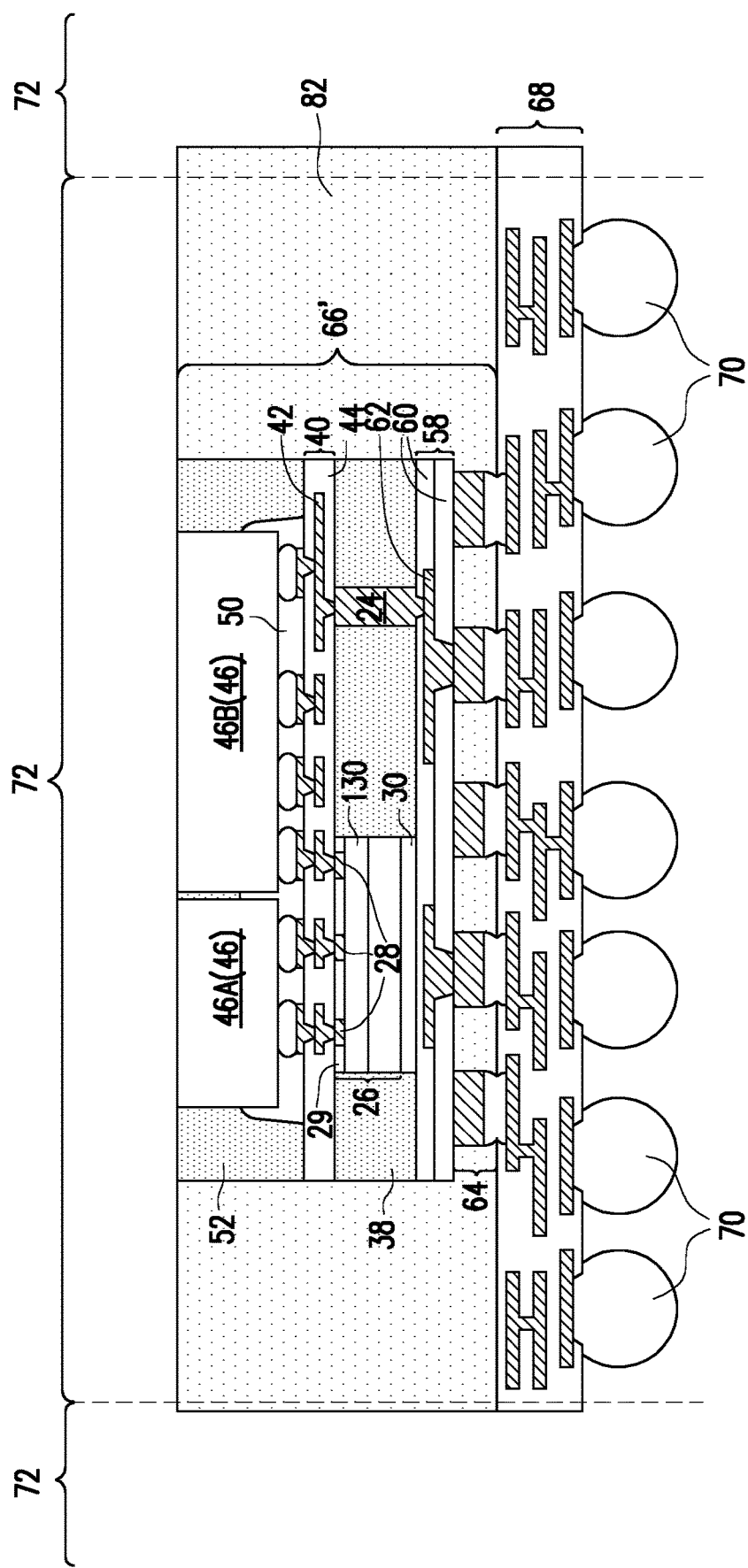

Referring to FIG. 18, package 66' is bonded to package substrate 68, for example, through solder bonding. In accordance with some embodiments of the present disclosure, a plurality of packages 66' are bonded to a plurality of package substrates 68 in a package substrate strip. Encapsulant 82 is applied to encapsulate the plurality of packages 66' therein. Encapsulant 82 may comprise molding compound, molding underfill, or the like. The package substrate strip and the encapsulant 82 are then singulated to form a plurality of packages 72.

Figure 19:
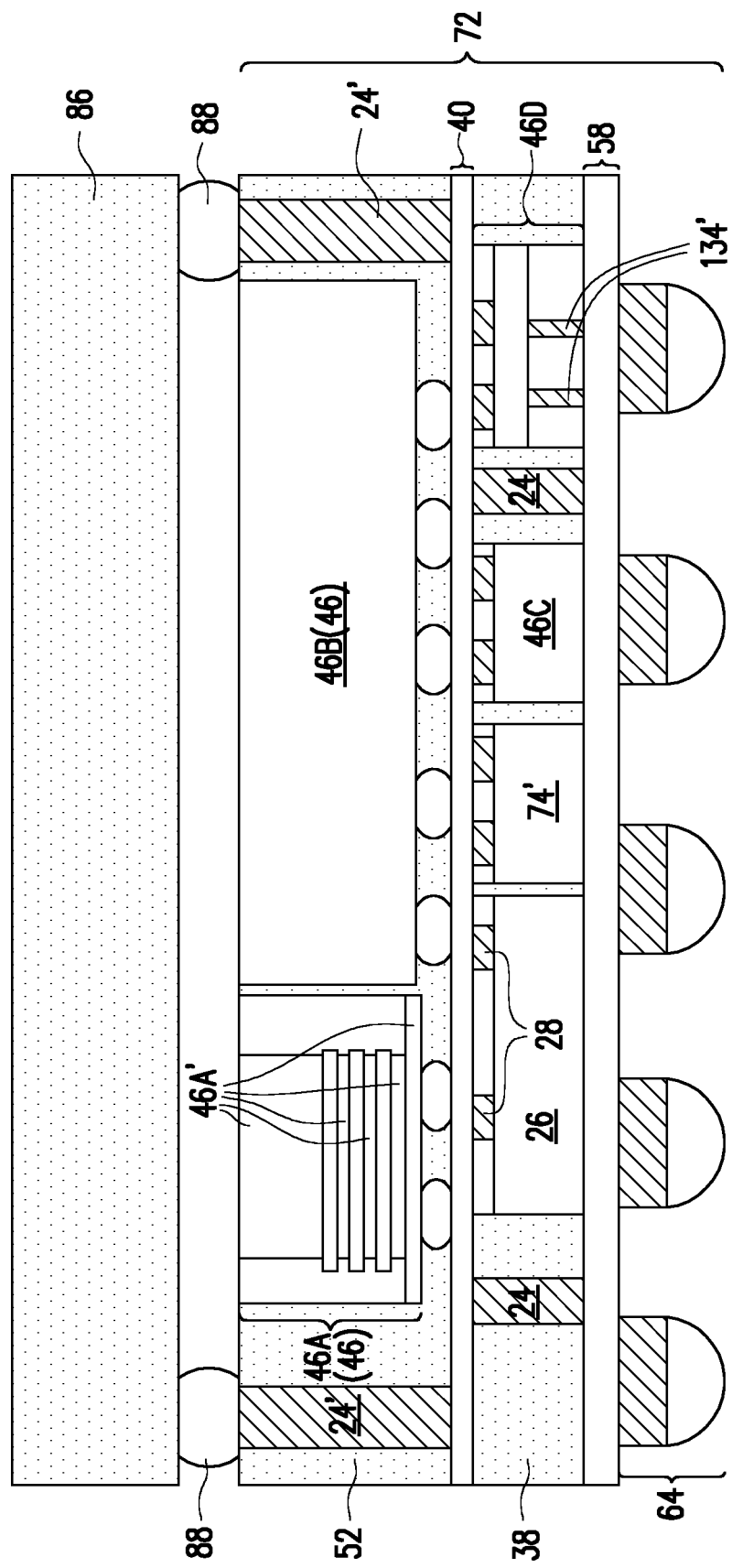
FIG. 19 illustrates a cross-sectional view of a package including a bridge die in accordance with some embodiments.

FIG. 19 illustrates package 72 in accordance with some embodiments. Besides bridge die 26 and through-vias 24, there are additional dies illustrated. For example, IPD die 74', memory die 46C (which may be a Static Random Access Memory (SRAM) die, a Dynamic Random Access Memory (DRAM) die, etc.), and Input/Output (I/O) die 46D are also encapsulated in encapsulant 38, and are electrically connected to redistribution structure 40. In accordance with some embodiments, package components 46A is a memory stack including a plurality of memory dies 46' stacked together. In accordance with some embodiments of the present disclosure, I/O die 46D includes TSVs 134' therein, which electrically interconnect redistribution structures 40 and 58. Through-vias 24' are formed over redistribution structure 40, and penetrate through encapsulant 58. Package 86, which may include memory dies, memory stacks, or the like therein, is bonded to through-vias 24', for example, through solder regions 88.

It is appreciated that the IPD die 74', memory die 46C, and I/O die 46D as shown in FIG. 19 may also be incorporated into the packages 72 as shown in FIGS. 6, 7, 12, and 18. Furthermore, although it is shown that bridge die 26 is under redistribution structure 40, and the interconnected package components 46A and 46B are bonded to redistribution structure 40, other schemes may be adopted. For example, bridge die 26 may be over and bonded to redistribution structure 40, while package components 46A and 46B may be encapsulated in encapsulant 38, with redistribution structure 40 formed thereon.

FIG. 20 illustrates a plane view of package 72 in accordance with some embodiments. Package components 46A may have structures and circuits identical to each other or different from each other. Package components 46B may have structures and circuits identical to each other or different from each other. A plurality of bridge dies 26 bond the package components 46A to the corresponding package components 46B. Each of bridge dies 26 interconnects at least one pair of package components 46A and 46B. In accordance with some embodiments, as shown in FIG. 20, one bridge die 26 may connect two package components 46A to the same package component 46B. The two package components 46A may also be interconnected to each other through bridge die 26. Furthermore, bridge die 26 may interconnect two package components 46B. FIG. 21 illustrates a plane view of package 72 in accordance with some embodiments. These embodiments are similar to the embodiments as shown in FIG. 20, except that each of bridge dies 26 connects to one pair of package components 46.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By using bridge dies to interconnect package components, the available number of electrical connections that can be established between two package components is significantly increased than using RDLs only for the interconnection. This is due to the small pitch and line width of the connections in the bridge dies. The interconnect structure formed over the bridge die also provides a planar surface to even out the different thicknesses of the bridge dies and other device dies, so that the package components may be arranged with no difficulty.

In accordance with some embodiments of the present disclosure, a structure comprises a bridge die comprises a semiconductor substrate; and an interconnect structure over the semiconductor substrate, wherein the interconnect structure comprises dielectric layers and conductive lines in the dielectric layers; an encapsulant encapsulating the bridge die therein; a redistribution structure over the bridge die, wherein the redistribution structure comprises redistribution lines therein; and a first package component and a second package component bonded to the redistribution lines, wherein the first package component and the second package component are electrically interconnected through the redistribution lines and the bridge die. In an embodiment, the bridge die is free from active devices therein. In an embodiment, the bridge die further comprises a first through-via penetrating through the semiconductor substrate. In an embodiment, the structure further comprises a second through-via penetrating through the encapsulant. In an embodiment, the structure further comprises a passive device die bonded to the redistribution structure. In an embodiment, the bridge die comprises a first portion overlapped by the first package component, and a second portion overlapped by the second package component. In an embodiment, all electrical paths that interconnect the first package component and the second package component pass through the bridge die. In an embodiment, the structure further comprises a package substrate on an opposite side of the bridge die than the first package component, wherein the package substrate is electrically coupled to the first package component, and wherein sidewalls of the package substrate are laterally recessed from respective sidewalls of the encapsulant.

In accordance with some embodiments of the present disclosure, a structure comprises a first redistribution structure comprising first redistribution lines therein; a bridge die over the first redistribution structure, wherein the bridge die comprises a semiconductor substrate; and a first through-via penetrating through the semiconductor substrate; a second through-via over the first redistribution structure; an encapsulant encapsulating the bridge die and the second through-via therein; a second redistribution structure over the bridge die and comprising second redistribution lines therein, wherein the first redistribution lines and the second redistribution lines are interconnected through the first through-via and the second through-via; and a first package component and a second package component over and bonded to the second redistribution structure, wherein the first package component and the second package component are electrically interconnected through the bridge die. In an embodiment, the bridge die is free from active devices and passive devices therein. In an embodiment, the structure further comprises a device die; and an adhesive film between, and contacting, the device die and the first redistribution structure.

In accordance with some embodiments of the present disclosure, a method comprises encapsulating a bridge die in an encapsulant, the bridge die comprises a semiconductor substrate; and an interconnect structure over the semiconductor substrate, wherein the interconnect structure comprises dielectric layers and metal lines in the dielectric layers; forming a first redistribution structure over the bridge die, wherein the first redistribution structure comprises first redistribution lines; and bonding a first package component and a second package component to the first redistribution lines, wherein the first package component and the second package component are electrically interconnected through the first redistribution lines and the bridge die. In an embodiment, the method further comprises forming a metal post, wherein the metal post is encapsulated by the encapsulant; and forming second redistribution lines on a backside of the semiconductor substrate, wherein the first redistribution lines and the second redistribution lines are interconnected through the metal post. In an embodiment, the bridge die further comprises a through-via extending into the semiconductor substrate, and the method further comprises performing a backside grinding to reveal the through-via, wherein the first redistribution lines and the second redistribution lines are further interconnected through the through-via. In an embodiment, the method further comprises performing a singulation process on the encapsulant and the redistribution structure to form a plurality of packages; bonding the packages to a package substrate strip; and singulating the package substrate strip. In an embodiment, the method further comprises forming a second redistribution structure, wherein the first redistribution structure and the second redistribution structure are on opposite sides of the bridge die; bonding a plurality of discrete package substrates on the second redistribution structure; and performing a singulation process on the encapsulant, the first redistribution structure, and the second redistribution structure to form a plurality of discrete packages. In an embodiment, the method further comprises placing the bridge die over a release film, wherein the release film is over a carrier; after the first redistribution lines are formed, removing the release film and the carrier; and performing a backside grinding process to reveal through-vias in the bridge die. In an embodiment, the method further comprises placing a device die, wherein the device die is placed on the release film through an adhesive film, and the device die and the adhesive film are encapsulated in the encapsulant, and wherein after the backside grinding process, a portion of the adhesive film remains in the encapsulant. In an embodiment, the method further comprises bonding passive devices on the first redistribution structure. In an embodiment, the bridge die is free from active devices therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a bridge die comprising:
        a semiconductor substrate;
        a first through-via penetrating through the semiconductor substrate;
        a first interconnect structure over the semiconductor substrate, wherein the first interconnect structure comprises dielectric layers and conductive lines in the dielectric layers;
    an encapsulant encapsulating the bridge die therein;
    a second through-via penetrating through the encapsulant;
    a first redistribution structure over the bridge die, wherein the first redistribution structure comprises redistribution lines therein; and
    a first package component and a second package component bonded to the redistribution lines, wherein the first package component and the second package component are electrically interconnected through the redistribution lines and the bridge die; and
    a second redistribution structure, wherein the bride die is between and is in physical contact with both of the first redistribution structure and the second redistribution structure, with the first through-via and the second through-via interconnecting the first redistribution structure and the second redistribution structure.

2. The structure of claim 1, wherein the bridge die is free from active devices therein.

3. The structure of claim 1, further comprising a passive device die bonded to the first redistribution structure.

4. The structure of claim 1, wherein the bridge die comprises a first portion overlapped by the first package component, and a second portion overlapped by the second package component.

5. The structure of claim 1, wherein all electrical paths that interconnect the first package component and the second package component pass through the bridge die.

6. The structure of claim 1, further comprising a package substrate on an opposite side of the bridge die than the first package component, wherein the package substrate is electrically coupled to the first package component, and wherein sidewalls of the package substrate are laterally recessed from respective sidewalls of the encapsulant.

7. A structure comprising:
    a first redistribution structure comprising first redistribution lines therein;
    a bridge die over the first redistribution structure, wherein the bridge die comprises:
        a semiconductor substrate; and
        a first through-via penetrating through the semiconductor substrate;
    a second through-via over the first redistribution structure;
    an encapsulant encapsulating the bridge die and the second through-via therein;
    a second redistribution structure over the bridge die and comprising second redistribution lines therein, wherein the first redistribution lines and the second redistribution lines are interconnected through the first through-via and the second through-via; and
    a first package component and a second package component over and bonded to the second redistribution structure, wherein the first package component and the second package component are electrically interconnected through the bridge die.

8. The structure of claim 7, wherein the bridge die is free from active devices and passive devices therein.

9. The structure of claim 7, further comprising:
    a device die; and
    an adhesive film between, and contacting, the device die and the first redistribution structure.

10. A structure comprising:
    a bridge die in an encapsulant, the bridge die comprising:
        a semiconductor substrate;
        a through-via penetrating through the semiconductor substrate; and
        an interconnect structure over the semiconductor substrate, wherein the interconnect structure comprises a first metal pad and a second metal pad;
    a first molding compound molding the bridge die therein;
    a through-molding via penetrating through the first molding compound;
    a first device die overlapping the first metal pad;

a second device die overlapping the second metal pad, wherein the first device die and the second device die are electrically interconnected through the bridge die;
a first redistribution structure connecting the first device die and the second device die to the bridge die; and
a second redistribution structure, wherein the first redistribution structure and the second redistribution structure are on opposing sides of the bridge die, and are electrically interconnected through the through-via.

11. The structure of claim 10, further comprising:
a second molding compound encapsulating first molding compound, the bridge die, the first device die, and the second device die therein.

12. The structure of claim 10, further comprising:
a third device die bonded to the first redistribution structure, wherein the third device die further comprising an additional semiconductor substrate; and
a dielectric layer contacting both of the semiconductor substrate of the bridge die and the additional semiconductor substrate.

13. The structure of claim 12, wherein a first surface of the semiconductor substrate and a second surface of the additional semiconductor substrate are coplanar.

14. The structure of claim 10, further comprising a passive device bonded to the first redistribution structure.

15. The structure of claim 14, wherein the passive device and the bridge die are on a same side of the first redistribution structure.

16. The structure of claim 10, wherein the bridge die is free from active devices therein.

17. The structure of claim 1, wherein the first through-via physically contacts the second redistribution structure.

18. The structure of claim 1, wherein the second through-via physically contacts both of the first redistribution structure and the second redistribution structure.

19. The structure of claim 10, wherein the through-via physically contacts the second redistribution structure.

* * * * *